(12) United States Patent
Hashidzume et al.

(10) Patent No.: US 7,439,577 B2
(45) Date of Patent: Oct. 21, 2008

(54) SEMICONDUCTOR MEMORY AND METHOD FOR MANUFACTURING THE SAME

(75) Inventors: Takahiko Hashidzume, Toyama (JP); Nobuyoshi Takahashi, Toyama (JP); Koji Yoshida, Toyama (JP); Keita Takahashi, Nara (JP); Kiyoshi Kurihara, Osaka (JP); Yoshiya Moriyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 170 days.

(21) Appl. No.: 11/495,780

(22) Filed: Jul. 31, 2006

(65) Prior Publication Data

US 2007/0108509 A1  May 17, 2007

(30) Foreign Application Priority Data

Nov. 11, 2005 (JP) ............................ 2005-327197
Apr. 21, 2006 (JP) ............................ 2006-117910

(51) Int. Cl.
*H01L 29/792* (2006.01)

(52) U.S. Cl. ............... 257/324; 257/411; 257/E29.309; 257/E21.18

(58) Field of Classification Search ................. 257/324, 257/E29.309
See application file for complete search history.

(56) References Cited

U.S. PATENT DOCUMENTS

| 6,828,625 | B2 | 12/2004 | Bloom et al. | |
|---|---|---|---|---|
| 6,833,581 | B1 | 12/2004 | Hui et al. | |
| 2004/0191989 | A1* | 9/2004 | Ngo et al. | 438/257 |
| 2006/0214218 | A1* | 9/2006 | Shishido et al. | 257/315 |

* cited by examiner

*Primary Examiner*—Tu-Tu V Ho
(74) *Attorney, Agent, or Firm*—McDermott Will & Emery LLP

(57) ABSTRACT

A semiconductor memory is provided with memory cells including bit lines made of a diffusion layer formed in a semiconductor substrate, charge-trapping gate insulating films formed between the bit lines and word lines formed on the gate insulating films. An interlayer insulating film is formed over the memory cells and bit line contact plugs are formed in the interlayer insulating film to be connected to the bit lines. Further, a light blocking film is formed on at least part of the interlayer insulating film covering the memory cells and part of the light blocking film formed on the interlayer insulating film extends from the surface to the inside of the interlayer insulating film in the neighborhood of the bit line contact plugs.

27 Claims, 29 Drawing Sheets

SEMICONDUCTOR MEMORY AND METHOD FOR MANUFACTURING THE SAME

CROSS-REFERENCE TO RELATED APPLICATION

This non-provisional application claims priority under 35 U.S.C. §119(a) of Japanese Patent Applications Nos. 2005-327197 filed in Japan on Nov. 11, 2005 and 2006-117910 filed in Japan on Apr. 21, 2006, the entire contents of which are hereby incorporated by reference.

BACKGROUND OF THE INVENTION

1. Field of the Invention

The present invention relates to a semiconductor memory including nonvolatile memories having charge-trapping gate insulating films and a method for manufacturing the same.

2. Description of Related Art

One of known electrically writable nonvolatile memories is a memory in which an interconnection layer made of a diffusion layer also functions as a source/drain of a memory transistor (virtual ground structure).

In recent years, semiconductor devices have been designed under hyperfine rules to provide highly-integrated structure, high performance and high reliability. In particular, it is very important to achieve high reliability in fine nonvolatile memories.

FIG. 26 illustrates a typical structure of memory cells 200 having charge-trapping gate insulating films. Bit lines 202 made of a diffusion layer are formed on a semiconductor substrate 201 and bit line oxide films 210, charge-trapping gate insulating films 203 and word lines 204 are formed thereon to provide memory cells 200.

The memory cells 200 are operated in the following manner. For data writing in the memory cell 200, electrons are injected into the gate insulating film 203. The injected electrons are trapped in the gate insulating film 203, thereby increasing threshold voltage Vt. The electrons injected are hot electrons generated near the bit lines 202. Data erasing is performed by injecting holes in the gate insulating film 203. The injected holes neutralize the electrons trapped in the gate insulating film 203, thereby decreasing Vt. The holes are injected using BTBT (Band To Band Tunneling) current generated near the bit lines 202.

After the memory cells 200 have been fabricated, wires for driving the memory cells 200 are formed. The wire formation is carried out by plasma etching, which generates UV light. The UV light may generate excited electrons when it enters the semiconductor substrate provided with the memory cells.

In recent years, the entry of the excited electrons into the gate insulating film 203 has been pointed as a problem because it decreases the reliability of the memory cells 200. As described above, the data writing into the memory cells 200 is performed by injecting the electrons into the gate insulating film 203. If the excited electrons generated by the UV light enter the gate insulating film 203, it means that an excess of the electrons are injected. Therefore, the Vt exceeds a predetermined value. Further, even if a predetermined amount of holes are injected into the gate insulating film 203 for data erasing, the electrons trapped in the gate insulating film 203 cannot be neutralized completely. Therefore, the Vt is not reduced to a predetermined value.

In particular, the neutralization of the electrons trapped in the gate insulating film 203 is performed by injecting the holes into the gate insulating film 203 using the BTBT current generated near the bit lines 202. Therefore, if unwanted excited electrons are trapped around the middle of the gate insulating film 203, they are hardly neutralized. In the case of a floating gate, however, the unwanted electrons, if injected in the floating gate, are easily erased by applying the UV light.

For the above-described reasons, the entry of the excited electrons generated by the UV light into the gate insulating film 203 makes it significantly difficult to adjust Vt by writing and erasing data in and from the memory cells 200. This leads to a decrease in reliability of the memory cells 200.

As a solution to this problem, there is a known method for forming a light blocking film in advance above the memory cells 200 to prevent the entry of the UV light generated during the formation of the wires.

FIGS. 27A and 27B are sectional views illustrating the structure of a semiconductor memory in which a light blocking film is formed over the memory cells. FIG. 27A shows the neighborhood of bit line contact plugs 209 and FIG. 27B shows the neighborhood of word line contact plugs 212.

As shown in FIGS. 27A and 27B, an interlayer insulating film 206 is formed over the memory cells 200 and a light blocking film 205 is formed on part of the interlayer insulating film 206 covering the memory cells 200. The light blocking film 205 prevents the UV light generated during the formation of wires (not shown) on the interlayer insulating film 206 from entering the neighborhood of the memory cells 200, thereby preventing the injection of unwanted excited electrons into the gate insulating film 203 in the memory cells 200.

The semiconductor memory shown in FIGS. 27A and 27B is fabricated by a method shown in FIGS. 28A to 28D.

First, as shown in FIG. 28A, bit lines 202 made of a diffusion layer are formed on a semiconductor substrate 201 and bit line oxide films 210, charge-trapping gate insulating films (not shown) and word lines 204 are formed thereon by a general technique to provide memory cells 200.

Then, as shown in FIG. 28B, an interlayer insulating film 206 and a light blocking film 205 are deposited over the memory cells 200. Then, the light blocking film 205 is partially removed using a photomask 213 such that the light blocking film 205 remains only above the memory cells 200 as shown in FIG. 28C.

Then, as shown in FIG. 28D, an insulating film 207 is deposited over the light blocking film 205 and contact holes are formed through the insulating film 207 and the interlayer insulating film 206 to reach the bit lines 202. Wiring material is then buried in the contact holes to form bit line contact plugs 209.

The light blocking film 205 is a conductive film such as an amorphous silicon film or a tungsten film. Therefore, the light blocking film 205 has to be separated from the bit line contact plugs 209 to prevent a short circuit between the bit line contact plugs 209.

As a result, during the formation of the wires on the insulating film 207 after the bit line contact plugs 209 have been provided, UV light passes through part of the insulating film 207 between the light blocking film 205 and the bit line contact plugs 209 to reach the neighborhood of the memory cells. This leads to an increase in Vt of the memory cells near the bit line contact plugs 209.

Further, if the distance between the bit line contact plugs 209 and the memory cells is increased to avoid the rise in Vt due to the entry of the UV light, the total area occupied the semiconductor memory increases.

As a solution to this, U.S. Pat. No. 6,833,581 describes a method for blocking the above-described entry path of the UV light. Detailed description thereof is provided below with reference to FIG. 29.

Referring to FIG. 29, an interlayer insulating film 206 and a light blocking film 205 are formed over the memory cells 200 and bit line contact plugs 209 are formed to penetrate the light blocking film 205 and the interlayer insulating film 206. The light blocking film 205 is made of an insulating film such as a silicon-rich oxide film or a silicon-rich nitride film. Therefore, even if the light blocking film 205 contacts the bit line contact plugs 209, a short circuit does not occur between the bit line contact plugs 209.

With the thus formed light blocking film 205, the entry path of the UV light generated during the formation of the wires on the interlayer insulating film 206 is blocked by the light blocking film 205 and the bit line contact plugs 209. This prevents the injection of unwanted excited electrons into the gate insulating film 203 in the memory cells 200.

The semiconductor memory shown in FIG. 29 is fabricated by the method shown in FIGS. 30A to 30D.

First, as shown in FIG. 30A, bit lines 202 made of a diffusion layer are formed on a semiconductor substrate 201 and bit line oxide films 210, charge-trapping gate insulating films 203 and word lines 204 are formed thereon by a general technique to provide memory cells 200.

Then, as shown in FIG. 30B, an interlayer insulating film 206 and a light blocking film 205 are deposited over the memory cells 200. Then, contact holes 215 reaching the bit lines 202 through the light blocking film 205 and the interlayer insulating film 206 are formed using a photomask 214 as shown in FIG. 30C.

Then, as shown in FIG. 30D, wiring material is buried in the contact holes 215 to form bit line contact plugs 209. Thus, the semiconductor memory shown in FIG. 29 is obtained.

SUMMARY OF THE INVENTION

The method described in U.S. Pat. No. 6,833,581 is actually advantageous in that the entry path of the UV light is blocked to prevent the injection of the unwanted excited electrons into the gate insulating film 203. However, since the light blocking film 205 is an insulating film, the light blocking property is low as compared with a conductive light blocking film. In reality, the entry of the UV light is not blocked to a satisfactory degree.

In addition to the low light blocking property of the insulating light blocking film described above, the inventors of the present invention have found another factor of the increase in Vt of the memory cells near the bit line contact plugs 209.

Specifically, they have found that the UV light generated by plasma etching reaches the neighborhood of the memory cells through the contact holes 215 in the step of forming the contact holes 215 shown in FIG. 30C.

As commonly known in the art, the bit line contact plugs 209 are formed on the bit lines extending along the periphery of the memory cells arranged in an array. Since the opening area of the contact holes 215 is extremely small, considerable attention has not been paid to the UV light reaching the neighborhood of the memory cells through the contact holes 215 during the formation thereof.

However, as the memory cells are designed under finer rules and the film thickness and the Vt are further reduced, the UV light entering through the above-described path cannot be negligible. This is considered as a cause of the increase in Vt of the memory cells near the bit line contact plugs 209. That is, in conventional semiconductor memories, attention has been paid only to the UV light generated during the formation of the wires above the memory cells, not to the UV light entering through the bit line contact holes 215.

The present invention has been achieved based on these findings. A major object of the present invention is to prevent variations in Vt due to the UV light generated during the manufacture of the semiconductor memory, thereby giving the semiconductor memory with high reliability, and to provide a method for manufacturing the same.

A semiconductor memory of the present invention is provided with memory cells including a plurality of bit lines made of a diffusion layer formed in a semiconductor substrate, charge-trapping gate insulating films formed between the bit lines and word lines formed on the gate insulating films, wherein an interlayer insulating film is formed over the memory cells and bit line contact plugs are formed in the interlayer insulating film to be connected to the bit lines. Further, a light blocking film is formed on at least part of the interlayer insulating film covering the memory cells and part of the light blocking film formed on the interlayer insulating film extends from the surface to the inside of the interlayer insulating film in the neighborhood of the bit line contact plugs.

According to the above-described structure, the light blocking film is provided above the memory cells and the sides of the memory cells near the bit line contact plugs. Therefore, the UV light generated during the formation of the contact plugs and wires is effectively prevented from entering the memory cells from above and the sides of the memory cells. As a result, the semiconductor memory is provided with high reliability while variations in Vt due to the UV light generated during the manufacture of the semiconductor memory are eliminated.

It is preferred that the part of the light blocking film extending in the interlayer insulating film is parallel to the word lines because the entry of the UV light from the sides of the memory cells near the bit line contact plugs is prevented with high efficiency. This improves the reliability of the semiconductor memory to a further extent.

It is preferred that the part of the light blocking film extending in the interlayer insulating film is in contact with the word line adjacent to the bit line contact plugs because the word line also functions as the light blocking film to prevent the entry of the UV light from the sides of the memory cells near the bit line contact plugs with high efficiency. This improves the reliability of the semiconductor memory to a further extent.

It is preferred that the part of the light blocking film extending in the interlayer insulating film is in contact with said word line with an insulating film interposed therebetween. The insulating film is preferably an insulating light blocking film.

This structure makes it possible to extend part of the light blocking film in the interlayer insulating film to be parallel to the bit lines, thereby preventing the entry of the UV light into the memory cells from the sides thereof near the word line contact plugs.

It is preferred that word line contact plugs are formed in the interlayer insulating film to be connected to the word lines and another part of the light blocking film extends in the interlayer insulating film in the neighborhood of the word line contact plugs.

It is preferred that said another part of the light blocking film extending in the interlayer insulating film is parallel to the bit lines.

It is preferred that the part of the light blocking film extending in the interlayer insulating film is formed in an opening formed in the interlayer insulating film.

It is preferred that the light blocking film is made of a stack of a conductive light blocking film and an insulating light blocking film.

It is preferred that the conductive light blocking film and the insulating light blocking film has a rough interface therebetween.

It is preferred that the word line in contact with the part of the light blocking film is a dummy word line which is not used for data storage.

It is preferred that the light blocking film is formed before the formation of the bit line contact plugs.

It is preferred that a stepped portion is formed in part of the interlayer insulating film near the word line adjacent to the bit line contact plugs and the height of the stepped portion is reduced to 100 nm or less by planarization. By so doing, a residue of a photoresist is less likely to occur in the photolithography step. Therefore, the semiconductor memory is provided with a desired geometry even if it is designed under finer rules.

It is preferred that the height of the part of the interlayer insulating film in which the bit line contact plugs are formed is not larger than the height of the word line adjacent to the bit line contact plugs.

It is preferred that difference in height between the part of the interlayer insulating film in which the bit line contact plugs are formed and the word line adjacent to the bit line contact plugs is 60 nm or less. By so doing, a residue of a photoresist is less likely to occur in the photolithography step. Therefore, the semiconductor memory is provided with a desired geometry even if it is designed under finer rules.

Another semiconductor memory of the present invention is provided with memory cells including a plurality of bit lines made of a diffusion layer formed in a semiconductor substrate, charge-trapping gate insulating films formed between the bit lines and word lines formed on the gate insulating films, wherein an insulating light blocking film is formed to cover a top surface and side surfaces of the memory cells and a conductive light blocking film is formed on at least part of the insulating light blocking film covering the memory cells.

According to this structure, the insulating light blocking film is formed to cover the top and side surfaces of the memory cells. Therefore, the entry of the UV light generated during the formation of the contact plugs and wires is prevented with efficiency. Further, the conductive light blocking film is formed closer to the memory cells, thereby preventing the UV light from entering the memory cells with high efficiency.

A method for manufacturing the semiconductor memory of the present invention provided with memory cells including a plurality of bit lines made of a diffusion layer formed in a semiconductor substrate, charge-trapping gate insulating films formed between the bit lines and word lines formed on the gate insulating films includes the steps of: forming an interlayer insulating film over the memory cells; forming a light blocking film on at least part of the interlayer insulating film covering the memory cells; and forming bit line contact plugs in the interlayer insulating film to be connected to the bit lines. In the step of forming the light blocking film, part of the light blocking film formed on the interlayer insulating film extends from the surface to the inside of the interlayer insulating film in the neighborhood of a region for forming the bit line contact plugs.

According to the method, the insulating light blocking film is formed to cover the top and side surfaces of the memory cells. Thus, the entry of the UV light generated during the formation of the contact plugs and wires into the memory cells is prevented by a simple method.

It is preferred that the step of forming the interlayer insulating film is followed by the step of forming an opening in part of the interlayer insulating film near the region for forming the bit line contact plugs and in the step of forming the light blocking film, the light blocking film is formed on at least part of the interlayer insulating film covering the memory cells and in the opening formed in the interlayer insulating film.

It is preferred that the opening is formed to expose the word line adjacent to the region for forming the bit line contact plugs and the light blocking film formed in the opening is in contact with said word line.

It is preferred that the step of forming the opening is followed by the step of forming an insulating light blocking film on at least side surfaces and a top surface of the opening and the light blocking film is in contact with said word line with the insulating light blocking film interposed therebetween.

It is preferred that the step of forming the interlayer insulating film over the memory cells is preceded by the step of forming an insulating light blocking film to cover a top surface and side surfaces of the memory cells, the opening is formed to expose the insulating light blocking film and the light blocking film formed in the opening is in contact with the insulating light blocking film.

It is preferred that the step of forming the bit line contact plugs is performed after the step of forming the light blocking film.

It is preferred that the step of forming the interlayer insulating film further includes the step of planarizing the interlayer insulating film such that a stepped portion generated in part of the interlayer insulating film near the word line adjacent to the bit line contact plugs is reduced to 100 nm or less in height.

It is preferred that the step of forming the interlayer insulating film further includes the step of removing a surface portion of part of the interlayer insulating film in the region for forming the bit line contact plugs such that the height of said part of the interlayer insulating film is reduced equal to or smaller than the height of the word line adjacent to the bit line contact plugs and in the step of forming the light blocking film, part of the light blocking film extends on said part of the interlayer insulating film reduced in height in the neighborhood of the region for forming the bit line contact plugs.

It is preferred that difference in height between said part of the interlayer insulating film reduced in height and the word line adjacent to the bit line contact plugs is 60 nm or less.

Another method for manufacturing the semiconductor memory of the present invention provided with memory cells including a plurality of bit lines made of a diffusion layer formed in a semiconductor substrate, charge-trapping gate insulating films formed between the bit lines and word lines formed on the gate insulating films includes the steps of: forming an insulating light blocking film to cover a top surface and side surfaces of the memory cells; and forming a conductive light blocking film on at least part of the insulating light blocking film covering the memory cells.

According to the method, the insulating light blocking film is formed to cover the top and side surfaces of the memory cells. Thus, the entry of the UV light generated during the formation of the contact plugs and wires into the memory cells is prevented by a simple method.

It is preferred that the step of forming the insulating light blocking film is followed by the step of making the surface of the insulating light blocking film rough.

In the semiconductor memory of the present invention, the light blocking film is formed above the memory cells and the sides of the memory cells near the bit line contact plugs to prevent the UV light generated during the formation of the contact plugs and wires from entering the memory cells from above and the sides thereof. Thus, the semiconductor memory is provided with high reliability while the variations in Vt due to the UV light generated during the manufacture of the semiconductor memory are eliminated.

DETAILED DESCRIPTION OF THE INVENTION

Figure 1:
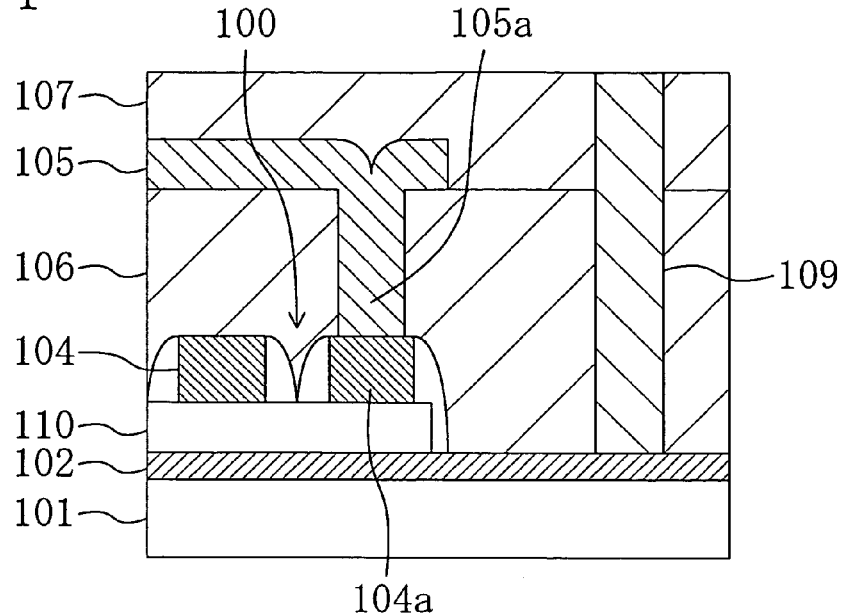
FIG. 1 is a sectional view schematically illustrating the structure of a semiconductor memory according to a first embodiment of the present invention.

Hereinafter, explanation of embodiments of the present invention will be provided with reference to the drawings. In the following drawings, components having substantially the same function are indicated by the same reference numerals for easy explanation. However, the present invention is not limited to the embodiments below.

First Embodiment

FIG. 1 is a schematic sectional view of the neighborhood of bit line contact plugs 109 for illustrating the structure of a semiconductor memory according to a first embodiment of the present invention.

As shown in FIG. 1, bit lines 102 made of a diffusion layer are formed on a semiconductor substrate 101, charge-trapping gate insulating films (not shown) are formed between the bit lines 102 and word lines 104 are formed on the gate insulating films to provide memory cells 100. An interlayer insulating film 106 is formed over the memory cells 100 and bit line contact plugs 109 are formed in the interlayer insulating film 106 to be connected to the bit lines 102.

A light blocking film 105 is formed on at least part of the interlayer insulating film 106 covering the memory cells 100. Part of the light blocking film 105 formed on the interlayer insulating film 106 (part indicated by the reference numeral 105a) extends from the surface to the inside of the interlayer insulating film 106 in the neighborhood of the bit line contact plugs 109.

The charge-trapping gate insulating film may be an ONO film made of a stack of a silicon oxide film, a silicon nitride film and a silicon oxide film or an ON film made of a stack of a silicon oxide film and a silicon nitride film. The light blocking film 105 may be a conductive film such as an amorphous silicon film or a tungsten film.

According to the structure shown in FIG. 1, the light blocking film 105 is provided above the memory cells 100 and the sides of the memory cells 100 near the bit line contact plugs 109. Therefore, even if there is a gap between the light blocking film 105 formed on the interlayer insulating film 106 and the bit line contact plugs 109, the entry of UV light generated during the formation of the contact plugs and wires is effectively prevented. As a result, the semiconductor memory is provided with high reliability while variations in Vt due to the UV light generated during the manufacture of the semiconductor memory are eliminated.

Figure 2:
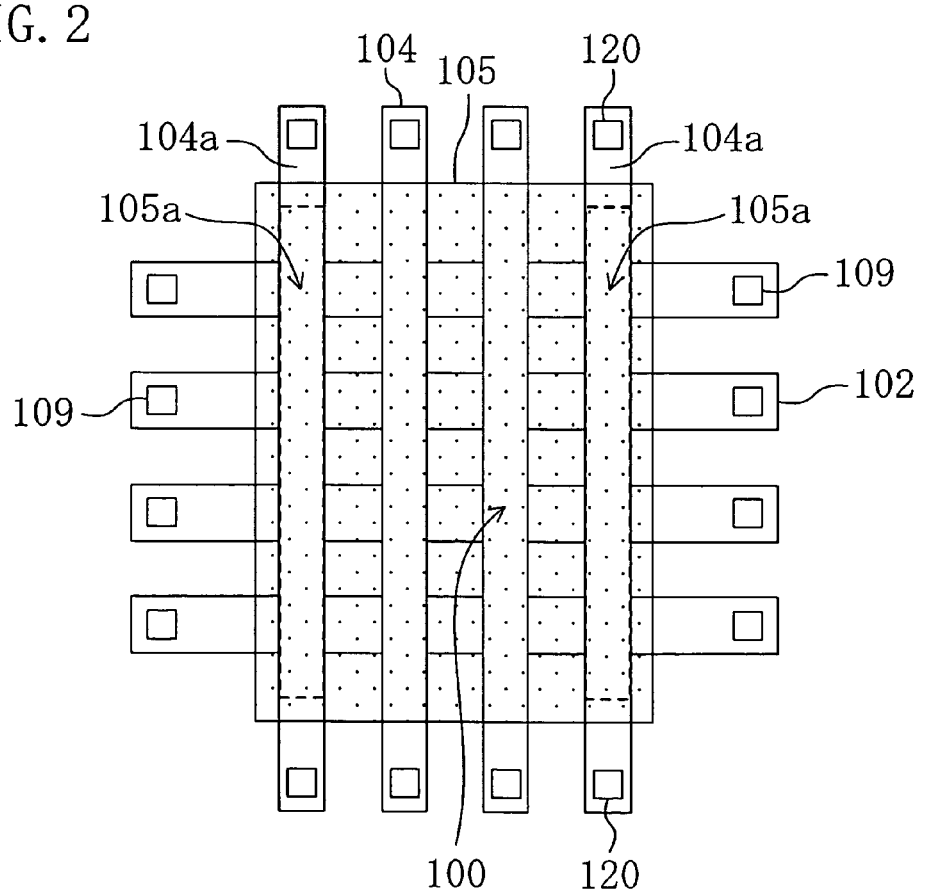
FIG. 2 is a plan view schematically illustrating the structure of the semiconductor memory according to the first embodiment of the present invention.

FIG. 2 is a plan view schematically illustrating the structure of the semiconductor memory shown in FIG. 1. As commonly known in the art, the memory cells 100 are arranged in an array and the bit lines 102 and the word lines 104 are arranged to be orthogonal to each other.

As shown in FIG. 2, the light blocking film 105 is formed on the interlayer insulating film 106 to cover the array of the memory cells 100. Parts of the light blocking film 105 near the bit line contact plugs 109 (parts 105a as indicated by dashed lines) are configured to extend to the inside of the interlayer insulating film 106.

The parts of the light blocking film 105 extending in the interlayer insulating film 106 are preferably parallel to the word lines 104 as shown in FIG. 2. That is, the parts 105a indicated by the dashed lines are preferably parallel to the word lines 104.

According to this structure, the UV light entering the memory cells 100 from the sides thereof near the bit line contact plugs 109 is prevented with high efficiency.

Moreover, as shown in FIGS. 1 and 2, the parts 105a of the light blocking film 105 extending in the interlayer insulating film 106 are preferably in contact with the word lines 104a adjacent to the bit line contact plugs 109.

According to this structure, the word lines 104a also function as the light blocking film, thereby preventing the UV light from entering the memory cells 100 from the sides thereof near the bit line contact plugs 109 with high efficiency.

In this case, the word lines 104a in contact with the extending parts 105a of the light blocking film 105 are fixed to the potential of the light blocking film 105. Therefore, the word lines 104a no longer have the inherent function of storing data and work as dummy word lines.

In a usual semiconductor memory, however, the word lines at the periphery of the memory cell array are often used as dummy word lines in consideration of characteristic variations that may be caused during the manufacturing process. Therefore, even if the word lines 104a adjacent to the bit line contact plugs 109 work as the dummy word lines to obtain the effect of the present invention, it is not a significant problem.

Hereinafter, the specific structure of the semiconductor memory and the method for manufacturing the same according to the present embodiment will be described with reference to the drawings.

FIGS. 3A to 3D are sectional views of the neighborhood of the bit line contact plugs 109 for illustrating the steps of the method for manufacturing the semiconductor memory of the present embodiment.

Figure 3A:
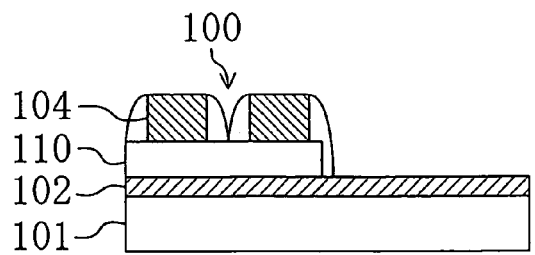
FIGS. 3A to 3D are sectional views illustrating the steps of a method for manufacturing the semiconductor memory according to the first embodiment of the present invention.

First, as shown in FIG. 3A, bit lines 102 made of an n$^+$ diffusion layer are formed on a semiconductor substrate 101, charge-trapping gate insulating films (not shown) are formed between the bit lines 102 and word lines 104 made of polysilicon are formed thereon by a known method to provide memory cells 100.

The charge-trapping gate insulating film may be an ONO film made of a stack of a 5 nm thick silicon oxide film, a 10 nm thick silicon nitride film and a 20 nm thick silicon oxide film.

Figure 3B:
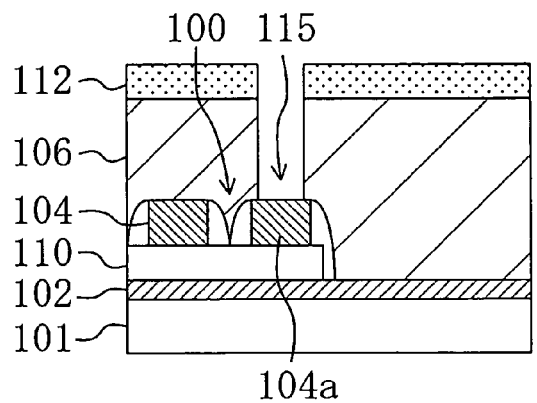

Then, as shown in FIG. 3B, an interlayer insulating film 106 made of a 30 to 200 nm thick silicon oxide film is formed over the memory cells 100 by CVD, for example. Then, an opening 115 is formed in part of the interlayer insulating film 106 near a region for forming the bit line contact plugs using a photomask 112.

Figure 3C:
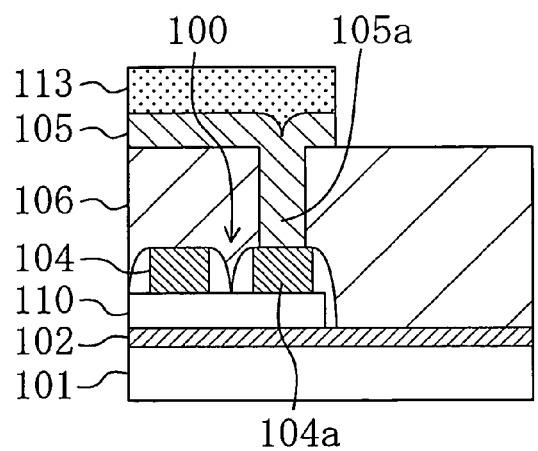

Then, as shown in FIG. 3C, a light blocking film 105 is formed on at least part of the interlayer insulating film 106 covering the memory cells 100. In this step, the light blocking film 105 extends also in the opening 115 formed in the part of the interlayer insulating film 106 near the region for forming the bit line contact plugs. The light blocking film 105 may be provided by depositing a 50 to 200 nm thick amorphous silicon film on the interlayer insulating film 106 by CVD, for example. Then, the light blocking film 105 is partially removed using a photomask 113 to leave part of the light blocking film 105 covering the memory cells 100.

Figure 3D:
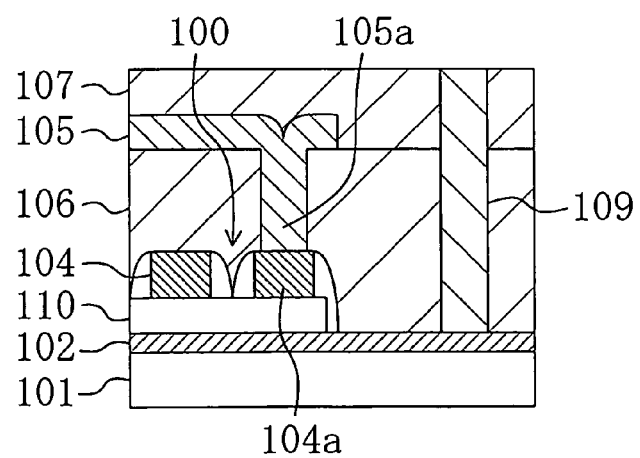

Then, as shown in FIG. 3D, an insulating film 107 is deposited over the light blocking film 105 and bit line contact plugs 109 are formed in the insulating film 107 and the interlayer insulating film 106 to be connected to the bit lines 102. Thus, the semiconductor memory as shown in FIG. 1 is obtained.

The opening 115 formed in the interlayer insulating film 106 may be configured to expose the word line 104a adjacent to the region for forming the bit line contact plugs as shown in FIG. 3B. Accordingly, part 105a of the light blocking film 105 formed in the opening 115 contacts the word line 104a as shown in FIG. 3C.

According to the above-described method, the light blocking film is formed above the memory cells 100 and on the sides of the memory cells 100 near the bit line contact plugs. Thus, the semiconductor memory is provided while the entry of UV light generated during the formation of the contact plugs and wires is prevented effectively by a simple method.

In the method for manufacturing the semiconductor memory explained with reference to FIGS. 3A to 3D, the opening 115 is formed in the interlayer insulating film 106 to obtain the light blocking film 105 extending from the surface to the inside of the interlayer insulating film 106. Hereinafter, a simpler method for forming the light blocking film 105 will be explained with reference to FIGS. 4A to 4D and FIGS. 5A to 5D, while detailed explanation of the same steps as those shown in FIGS. 3A to 3D is omitted.

FIGS. 4A to 4D are sectionals views illustrating the steps of another method for forming the light blocking film 105.

Figure 4A:
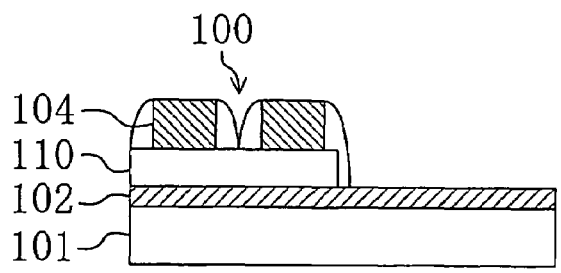
FIGS. 4A to 4D are sectional views illustrating the steps of another method for manufacturing the semiconductor memory according to the first embodiment of the present invention.

First, as shown in FIG. 4A, bit lines 102 are formed on a semiconductor substrate 101 and charge-trapping gate insulating films (not shown) and word lines 104 are formed thereon to provide memory cells 100.

Figure 4B:
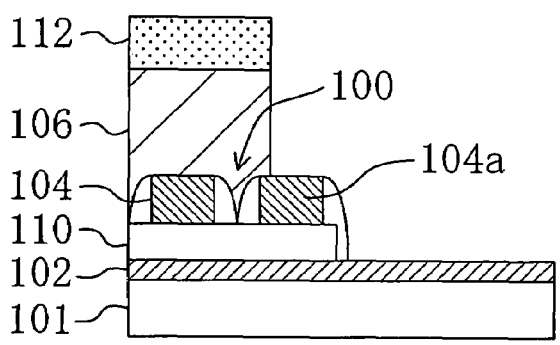

Then, as shown in FIG. 4B, an interlayer insulating film 106 is deposited over the memory cells 100 and part of which is removed using a photomask 112 to expose the top surface of a word line 104a adjacent to the region for forming the bit line contact plugs. This removal step is carried out not to expose the word lines 104 formed above the surface of the semiconductor substrate 101.

Figure 4C:
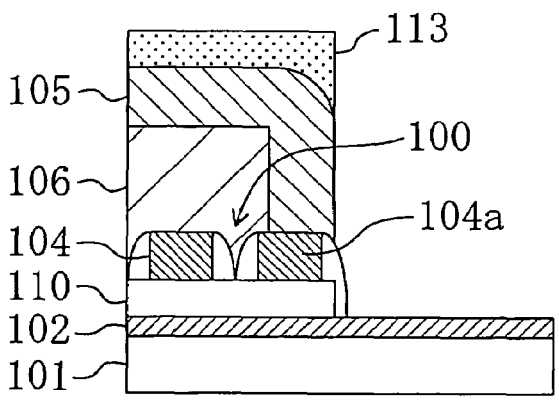

Then, as shown in FIG. 4C, a light blocking film 105 is deposited over the interlayer insulating film 106 and then partially etched away using a photomask 113 to leave part of the light blocking film 105 covering the top and side surfaces of the interlayer insulating film 106.

Figure 4D:
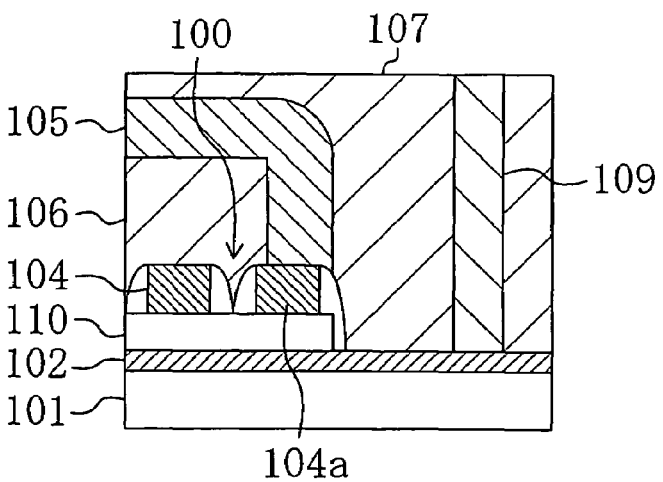

Then, as shown in FIG. 4D, an insulating film 107 is deposited over the light blocking film 105 and bit line contact plugs 109 are formed to penetrate the insulating film 107. Thus, the semiconductor memory of the present embodiment is obtained.

If a conductive light blocking film is used as the light blocking film 105, part of the light blocking film 105 remaining on the side surfaces of the interlayer insulating film 106 needs to be patterned not to contact the bit lines 102 exposed near the region for forming the bit line contact plugs 109.

According to the above-described method, the photomask 113 used in the step of FIG. 4C has the same geometry as that of the photomask 112 used in the step of FIG. 4B. Therefore, the photomasks 112 and 113 may be formed using the same exposure mask by adjusting the amount of light exposure to change the size of the openings. This reduces the number of exposure masks used as compared with the method shown in FIGS. 3A to 3D, thereby reducing production cost.

FIGS. 5A to 5D are sectional views illustrating the steps of still another method for forming the light blocking film 105.

Figure 5A:
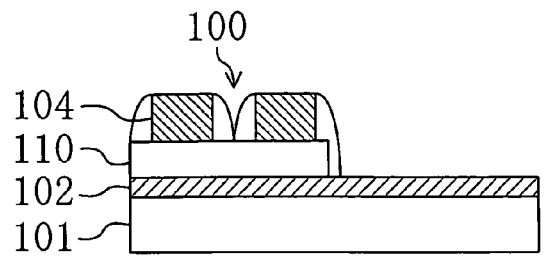
FIGS. 5A to 5D are sectional views illustrating the steps of still another method for manufacturing the semiconductor memory according to the first embodiment of the present invention.

First, as shown in FIG. 5A, bit lines 102 are formed on a semiconductor substrate 101 and charge-trapping gate insulating films (not shown) and word lines 104 are formed thereon to provide memory cells 100.

Figure 5B:
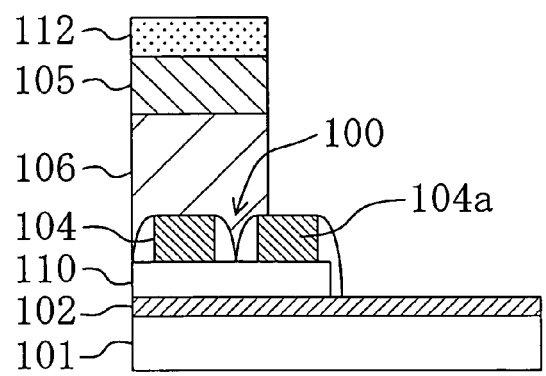

Then, as shown in FIG. 5B, an interlayer insulating film 106 and a light blocking film 105 are deposited over the memory cells 100 and partially etched away using a photomask 112 such that the top surface of the word line 104a adjacent to the region for forming the bit line contact plugs is exposed. This removal step is carried out not to expose the word lines 104 formed above the semiconductor substrate 101.

Figure 5C:
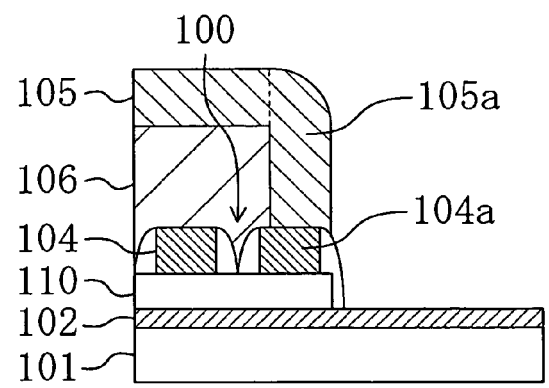

Then, as shown in FIG. 5C, a second light blocking film is deposited on the light blocking film 105 and anisotropically etched to provide a sidewall film 105a made of the second light blocking film on the side surface of the interlayer insulating film 106. Thus, the top and side surfaces of the interlayer insulating film 106 are covered with the light blocking films 105 and 105a.

Figure 5D:
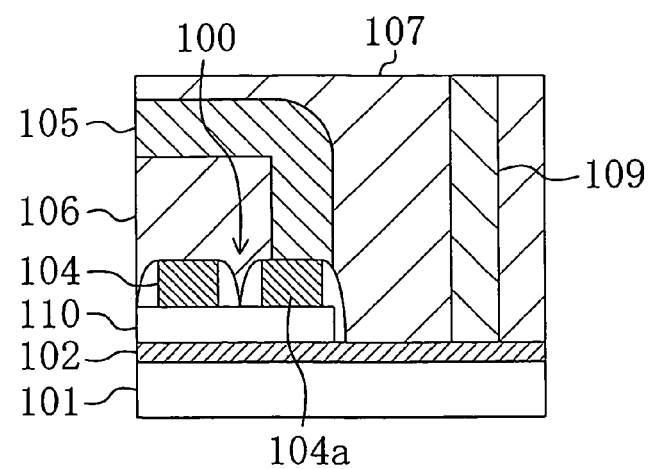

Then, as shown in FIG. 5D, an insulating film 107 is deposited over the light blocking film 105 and bit line contact plugs 109 are formed in the insulating film 107. Thus, the semiconductor memory of the present embodiment is obtained.

If a conductive light blocking film is used as the light blocking films 105 and 105a, it is necessary to carry out the anisotropic etching such that the light blocking sidewall film 105a does not contact the bit lines 102 exposed near the region for forming the bit line contact plugs 109.

According to the above-described method, the light blocking sidewall film 105a formed on the side surface of the interlayer insulating film 106 is self-aligned by anisotropic etching. Therefore, as compared with the methods shown in FIGS. 3A to 3D and FIGS. 4A to 4D, one photomask step is omitted. Further, in the step of forming the photomask, an alignment margin required between the bit line contact plugs 109 and the memory cells 100 is reduced. This makes it possible to reduce the production cost and design the semiconductor memory under finer rules.

In the methods shown in FIGS. 4A to 4D and FIGS. 5A to 5D, the insulating film 107 provided with the bit line contact plugs 109 is formed in the step different from the step of forming the interlayer insulating film 106. However, the thus-formed insulating film 107 and interlayer insulating film 106 are regarded as the same as the interlayer insulating film 106 shown in FIG. 1 provided with the bit line contact plugs 109.

Therefore, referring to FIGS. 4D and 5D, the sidewall film 105a provided to contact the word line 104a is substantially the same as the part of the light blocking film 105 extending from the surface to the inside of the interlayer insulating film 106.

Second Embodiment

In the semiconductor memory of the first embodiment shown in FIG. 1, part of the light blocking film extends in the interlayer insulating film 106 to be parallel to the word lines 104 as shown in FIG. 2 such that the entry of the UV light into the memory cells 100 from the sides of the memory cells 100 near the bit line contact plugs 109 is effectively prevented.

The distance from the bit line contact plugs 109 to the word line adjacent thereto is usually shorter than the distance from the word line contact plugs 116 to the bit line 102 adjacent thereto. Therefore, it is more effective to prevent the UV light entering the memory cells 100 from the sides thereof near the bit line contact plugs 109 than to prevent the UV light coming to the memory cells 100 from the sides thereof near the word line contact plugs 116. For this reason, the structure of the light blocking film 105 according to the first embodiment is extremely effective for improving the reliability of the semiconductor memory.

However, as the semiconductor memory design becomes finer, the distance between the word line contact plugs 116 and the adjacent bit line 102 is also reduced as a natural result. Therefore, the UV light entering the memory cells 100 from the sides thereof near the word line contact plugs 116 has to be taken care of.

In this point of view, part of the light blocking film 105 is configured to extend in the interlayer insulating film 106 not only parallel to the word lines 104 but also to the bit lines 102.

However, when the part of the light blocking film 105 extends in the interlayer insulating film 106 to contact the word line 104a as shown in FIG. 1 and another part thereof is further configured to extend in the interlayer insulating film 106 parallel to the bit lines 102, a short circuit occurs between the word lines 104 via the part of the light blocking film 105 extending parallel to the bit lines 102.

As a solution to such a problem, the second embodiment proposes a semiconductor memory in which the UV light entering the memory cells from the sides thereof near the word line contact plugs is effectively prevented. Hereinafter, specific explanation is provided with reference to FIGS. 6A, 6B and 7, while detailed explanation of the same structure as that described in the first embodiment is omitted.

Figure 6A:
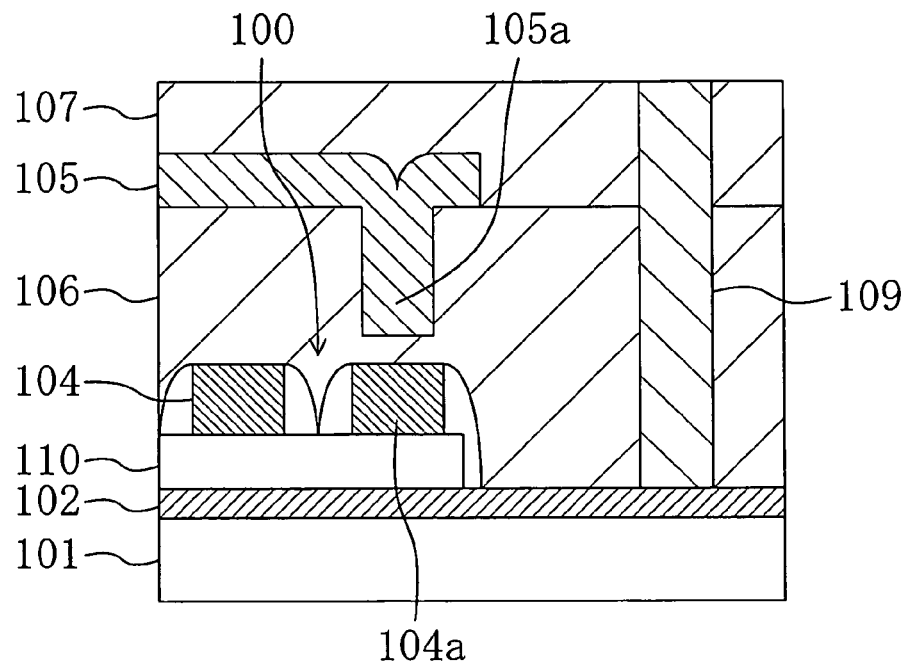
FIG. 6A is a sectional view illustrating the neighborhood of bit line contact plugs of a semiconductor memory according to a second embodiment of the present invention and FIG. 6B is a sectional view illustrating the neighborhood of word line contact plugs of the same.
Figure 6B:
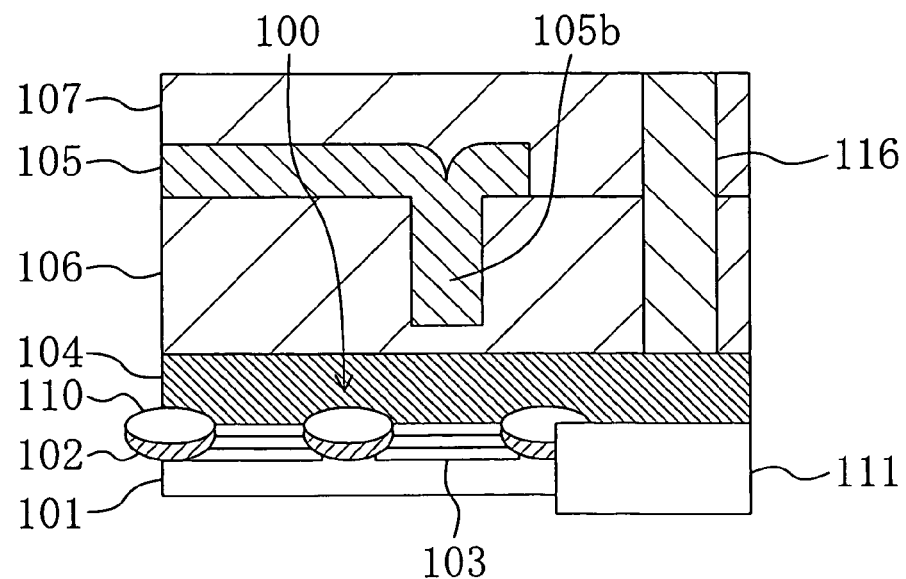

FIGS. 6A and 6B are sectional views schematically illustrating the structure of a semiconductor memory according to the second embodiment of the present invention. FIG. 6A shows the neighborhood of the bit line contact plugs 109 and FIG. 6B shows the neighborhood of the word line contact plugs 116.

As shown in FIGS. 6A and 6B, bit lines 102 made of a diffusion layer are formed on a semiconductor substrate 101, charge-trapping gate insulating films 103 are formed between the bit lines 102 and word lines 104 are formed on the gate insulating film 103 to provide memory cells 100. An interlayer insulating film 106 is formed over the memory cells 100 and bit line contact plugs 109 and word line contact plugs 116 are formed in the interlayer insulating film 106 to be connected to the bit lines 102 and the word lines 104, respectively.

A light blocking film 105 is formed on at least part of the interlayer insulating film 106 covering the memory cells 100. Part of the light blocking film 105 (indicated by reference numeral 105a) near the bit line contact plugs 109 and part of the light blocking film 105 (indicated by reference numeral 105b) near the word line contact plugs 116 are configured to extend from the surface to the inside of the interlayer insulating film 106.

Figure 7:
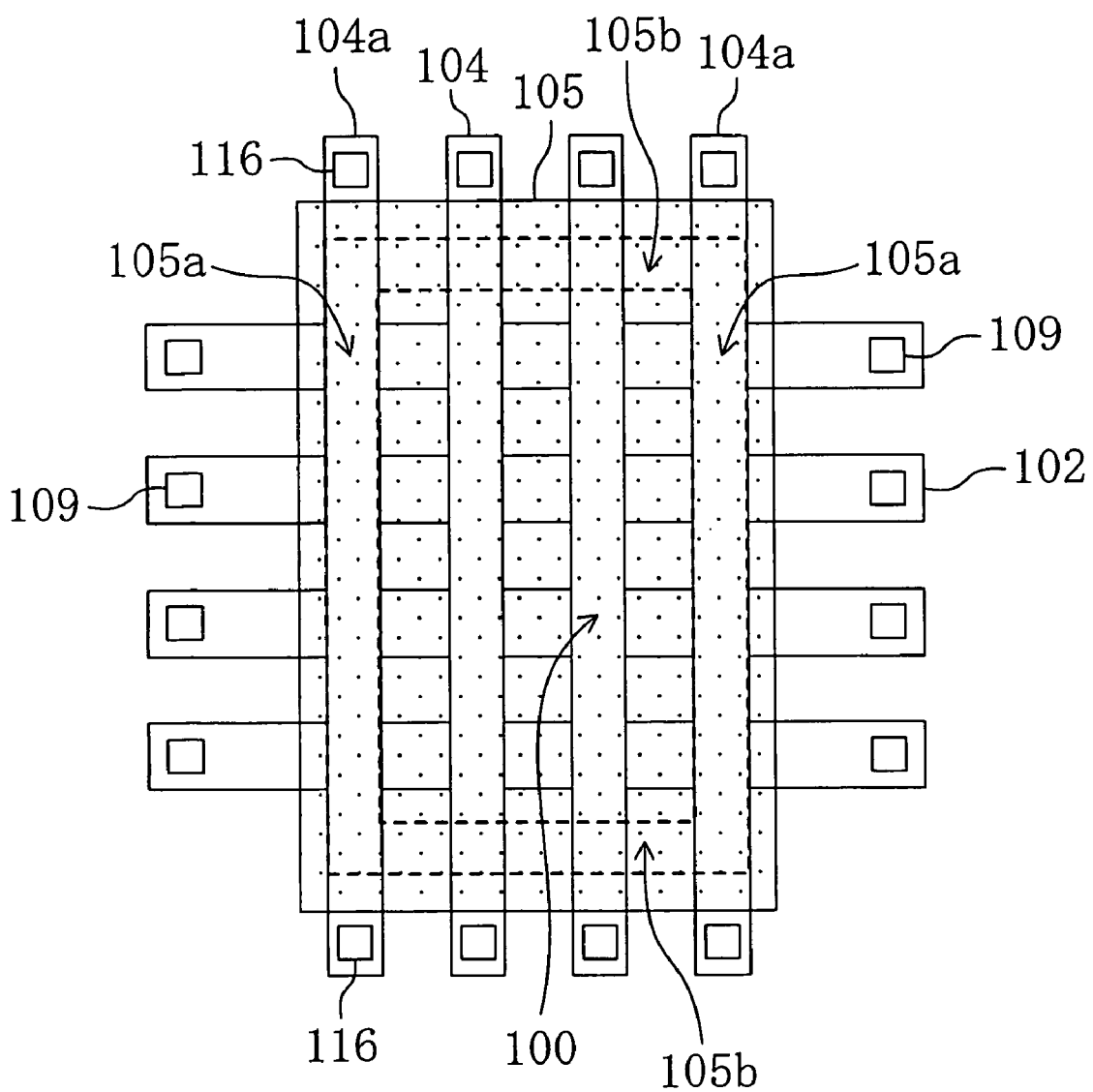
FIG. 7 is a plan view schematically illustrating the structure of the semiconductor memory according to the second embodiment of the present invention.

FIG. 7 is a plan view schematically illustrating the structure of the semiconductor memory shown in FIGS. 6A and 6B. As commonly known in the art, the memory cells 100 are arranged in an array and the bit lines 102 and the word lines 104 are arranged to be orthogonal to each other.

As shown in FIG. 7, the light blocking film 105 is formed on the interlayer insulating film 106 to cover the array of the memory cells 100 and parts thereof (105a and 105b as indicated by dashed lines) near the bit line contact plugs 109 and the word line contact plugs 116 are configured to extend in the interlayer insulating film 106. The parts 105a and 105b of the light blocking film 105 extending in the interlayer insulating film 106 are parallel to the word lines 104 and the bit lines 102, respectively.

In the present embodiment shown in FIGS. 6A and 6B, the extending parts 105a and 105b of the light blocking film 105 in the interlayer insulating film 106 do not contact the word lines 104. Therefore, the extending part 105b parallel to the bit lines 102 do not cause a short circuit between the word lines 104.

Thus, the structure shown in FIGS. 6A and 6B prevents not only the entry of the UV light into the memory cells 100 from the sides thereof near the bit line contact plugs 109 but also the entry of the UV light into the memory cells 100 from the sides thereof near the word line contact plugs 116. Accordingly, even if the design of the semiconductor memory becomes finer, the semiconductor memory is provided with high reliability while the variations in Vt due to the UV light generated during the formation of the contact plugs and wires are eliminated.

The extending parts 105a and 105b of the light blocking film 105 in the interlayer insulating film 106 do not contact the word lines 104. Therefore, the word lines adjacent to the bit line contact plugs 109 can be used as word lines for data storage without any problem.

Next, a method for manufacturing the semiconductor memory according to the second embodiment will be explained with reference to FIGS. 8A to 8D and FIGS. 9A to 9D, while detailed explanation of the same steps as those of the first embodiment shown in FIGS. 3A to 3D is omitted.

FIGS. 8A to 8D and FIGS. 9A to 9D are sectional views illustrating the steps of the method for manufacturing the semiconductor memory of the present embodiment. FIGS. 8A to 8D show the neighborhood of the bit line contact plugs 109 and FIGS. 9A to 9D show the neighborhood of the word line contact plugs 116.

Figure 8A:
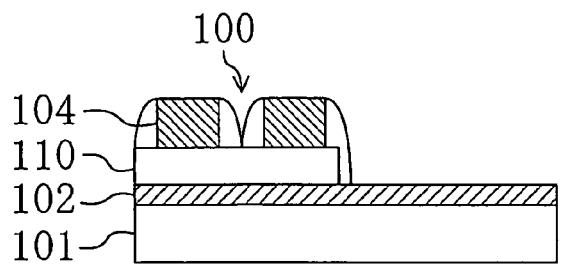
FIGS. 8A to 8D are sectional views illustrating the steps of a method for manufacturing the semiconductor memory according to the second embodiment of the present invention.
Figure 9A:
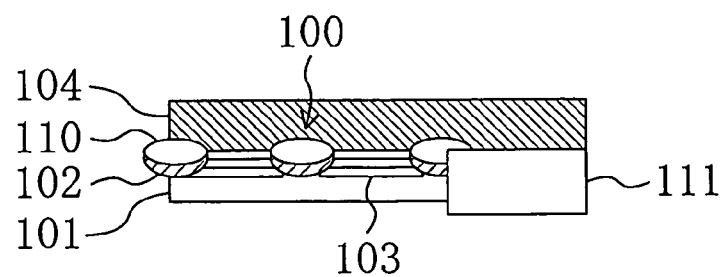
FIGS. 9A to 9D are sectional views illustrating the steps of the method for manufacturing the semiconductor memory according to the second embodiment of the present invention.

First, as shown in FIGS. 8A and 9A, bit lines 102 made of an n+ diffusion layer are formed on a semiconductor substrate 101 and bit line oxide films 110, charge-trapping gate insulating films 103 made of an ONO film and word lines 104 made of polysilicon are formed thereon to provide memory cells 100.

Figure 8B:
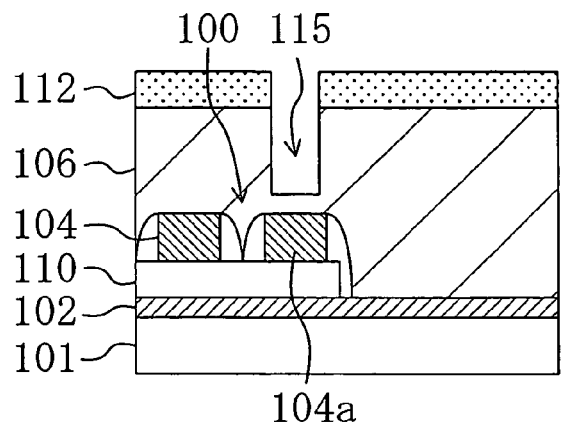
Figure 9B:
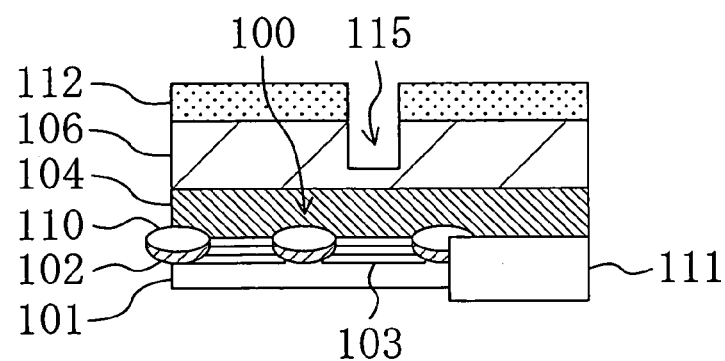

Then, as shown in FIGS. 8B and 9B, an interlayer insulating film 106 made of a silicon oxide film is formed over the memory cells 100. Then, using a photomask 112, openings 115 are formed in the interlayer insulating film 106 near a region for forming bit line contact plugs and a region for forming word line contact plugs. The opening 115 near the region for forming bit line contact plugs is parallel to the word lines 104 and the opening 115 near the region for forming word line contact plugs is parallel to the bit lines 102.

Figure 8C:
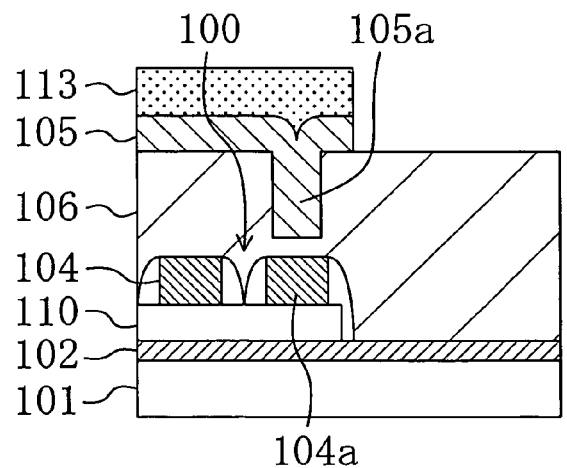
Figure 9C:
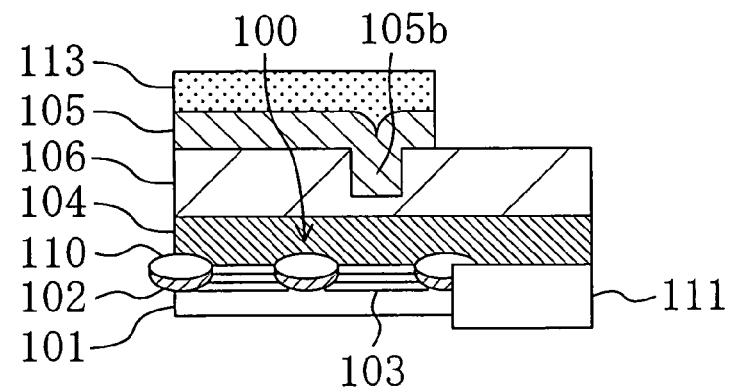

Then, as shown in FIGS. 8C and 9C, a light blocking film 105 is formed on at least part of the interlayer insulating film 106 covering the memory cells 100. In this step, parts of the light blocking film 105 extend in the openings 115 formed in the interlayer insulating film 106 near the region for forming the bit line contact plugs and the region for forming the word line contact plugs. Then, the light blocking film 105 is partially etched away using a photomask 113 to leave part of the light blocking film 105 covering the memory cells 100.

Figure 8D:
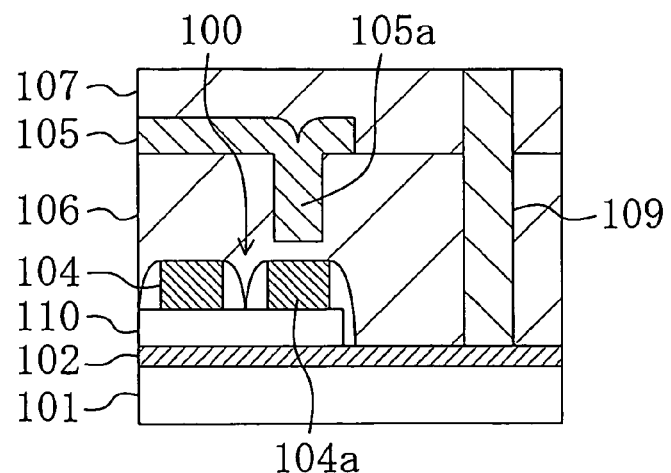
Figure 9D:
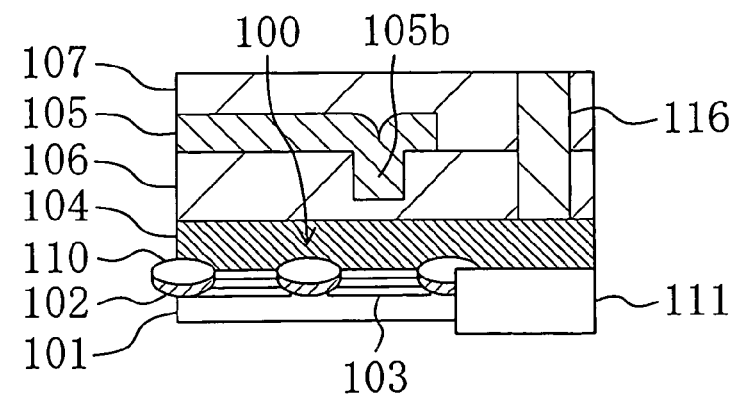

Then, as shown in FIGS. 8D and 9D, an insulating film 107 is deposited over the light blocking film 105. Then, bit line contact plugs 109 and word line contact plugs 116 are formed in the insulating film 107 and the interlayer insulating film 106 to be connected to the bit lines 102 and the word lines 104, respectively. Thus, the semiconductor memory shown in FIGS. 6A and 6B is obtained.

Third Embodiment

In the semiconductor memory of the second embodiment shown in FIGS. 6A and 6B, part of the light blocking film 105 extends in the interlayer insulating film 106 to be parallel to the word lines 104 and another part of the light blocking film 105 extends in the interlayer insulating film 106 to be parallel to the bit lines 102, thereby preventing the UV light from entering the memory cells 100 from the sides thereof near the bit line contact plugs 109 and the sides thereof near the word line contact plugs 116 with efficiency.

In the step shown in FIGS. 8B and 9B, it is preferable to extend the openings 115 in the interlayer insulating film 106 to be as close as possible to the word lines 104. However, since the openings 115 are formed by the time-based etching of the interlayer insulating film 106, it is difficult to equalize the depths of the openings 115.

In this point of view, the third embodiment proposes a semiconductor memory in which the depth of part of the light blocking film 105 extending in the interlayer insulating film 106 is appropriately controlled. Hereinafter, specific explanation is provided with reference to FIGS. 10A and 10B, while detailed explanation of the same steps as those of the second embodiment is omitted.

Figure 10A:
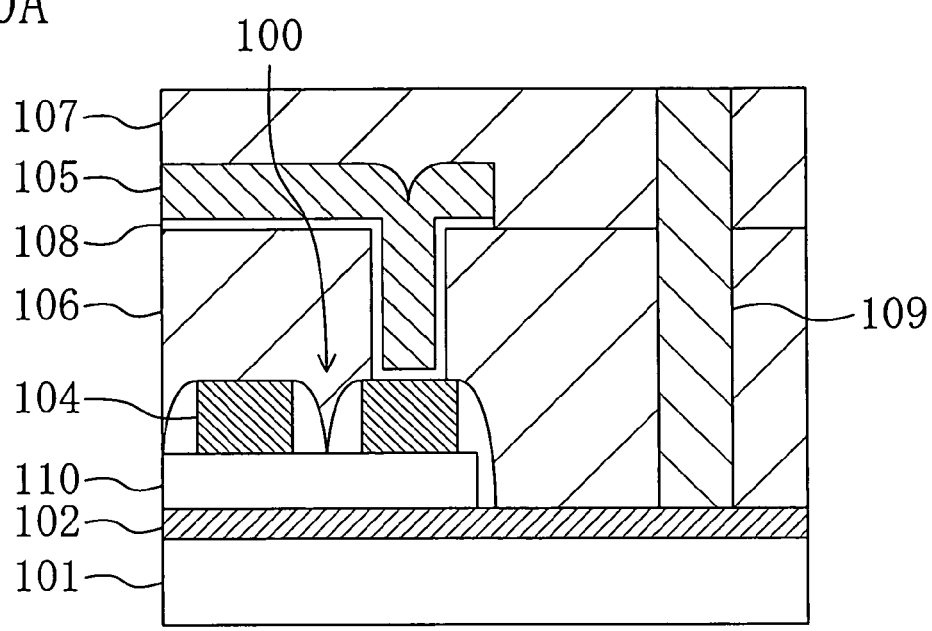
FIG. 10A a sectional view illustrating the neighborhood of bit line contact plugs of a semiconductor memory according to a third embodiment of the present invention and FIG. 10B is a sectional view illustrating the neighborhood of word line contact plugs of the same.
Figure 10B:
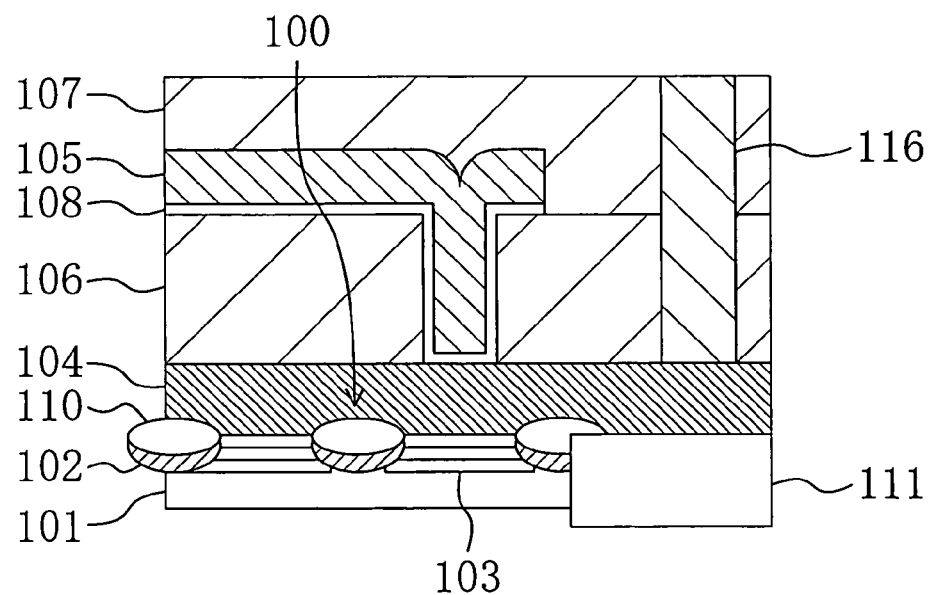

FIGS. 10A and 10B are sectional views schematically illustrating the structure of the semiconductor memory of the third embodiment of the present invention. FIG. 10A shows the neighborhood of the bit line contact plugs 109 and FIG. 10B shows the neighborhood of the word line contact plugs 116.

As shown in FIGS. 10A and 10B, bit lines 102 made of a diffusion layer are formed on a semiconductor substrate 101, charge-trapping gate insulating films 103 are formed between the bit lines 102 and word lines 104 are formed on the gate insulating films 103 to provide memory cells 100. An interlayer insulating film 106 is formed over the memory cells 100 and bit line contact plugs 109 and word line contact plugs 116 are formed in the interlayer insulating film 106 to be connected to the bit lines 102 and the word lines 104, respectively.

An insulating light blocking film 108 and a conductive light blocking film 105 are formed on at least part of the interlayer insulating film 106 covering the memory cells 100. Further, parts of the insulating light blocking film 108 and parts of the conductive light blocking film 105 are configured to extend from the surface to the inside of the interlayer insulating film 106 in the neighborhood of the bit line contact plugs 109 and the word line contact plugs 116.

The insulating light blocking film 108 may be a silicon nitride film, a silicon-rich nitride film or a silicon-rich oxide film of 20 to 50 nm thick. The conductive light blocking film 105 may be made of an amorphous silicon film or a tungsten film of 50 to 200 nm thick.

According to the structure shown in FIGS. 10A and 10B, the thickness of the insulating light blocking film 108 formed in the interlayer insulating film 106 is controlled as thin as 20 to 50 nm. Therefore, the conductive light blocking film 105 extending in the interlayer insulating film 106 is provided closer to the word lines 104. As a result, the UV light entering the memory cells 100 from the sides thereof near the bit line contact plugs 109 and the sides thereof near the word line contact plugs 116 is effectively blocked.

Since the insulating light blocking film 108 also has the inherent light blocking property, improvement in UV light blockage is achieved in conjunction with the conductive light blocking film 105. Concurrently, the insulating light blocking film 108 also functions as an insulator between the word lines 104 and the conductive light blocking film 105. This allows providing part of the light blocking film 105 extending in the interlayer insulating film 106 parallel to the word lines 104 and part of the light shied film 105 extending in the interlayer insulating film 106 parallel to the bit lines 102 in the same manner as in the second embodiment.

Next, a method for manufacturing the semiconductor memory of the third embodiment will be explained with reference to FIGS. 11A to 11D and FIGS. 12A to 12D, while detailed explanation of the same structure as that described in the second embodiment is omitted.

FIGS. 11A to 11D and FIGS. 12A to 12D are sectional views illustrating the steps of the method for manufacturing the semiconductor memory of the present embodiment. FIGS. 11A to 11D show the neighborhood of the bit line contact plugs 109 and FIGS. 12A to 12D show the neighborhood of the word line contact plugs 116.

Figure 11A:
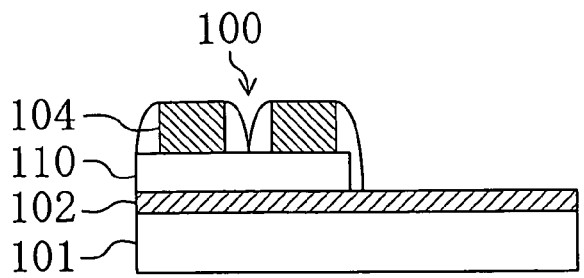
FIGS. 11A to 11D are sectional views illustrating the steps of a method for manufacturing the semiconductor memory according to the third embodiment of the present invention.
Figure 12A:
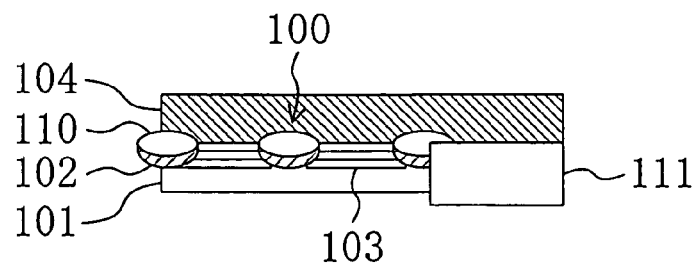
FIGS. 12A to 12D are sectional views illustrating the steps of a method for manufacturing the semiconductor memory according to the third embodiment of the present invention.

First, as shown in FIGS. 11A and 12A, bit lines 102 are formed on a semiconductor substrate 101 and bit line oxide films 110, charge-trapping gate insulating films 103 and word lines 104 are formed thereon to provide memory cells 100.

Figure 11B:
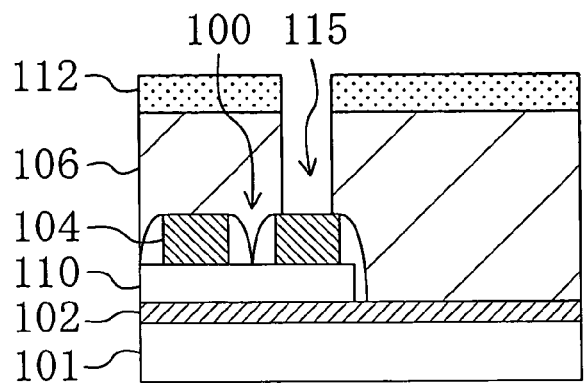
Figure 12B:
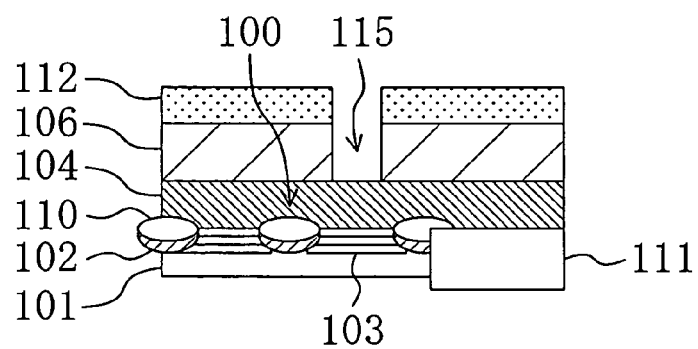

Then, as shown in FIGS. 11B and 12B, an interlayer insulating film 106 is formed over the memory cells 100. Then, openings 115 are formed in parts of the interlayer insulating film 106 near the region for forming bit line contact plugs and the region for forming the word line contact plugs using a photomask 112 to expose the word lines 104. The opening 115 near the region for forming bit line contact plugs is parallel to the word lines 104 and the opening 115 near the region for forming word line contact plugs is parallel to the bit lines 102.

Figure 11C:
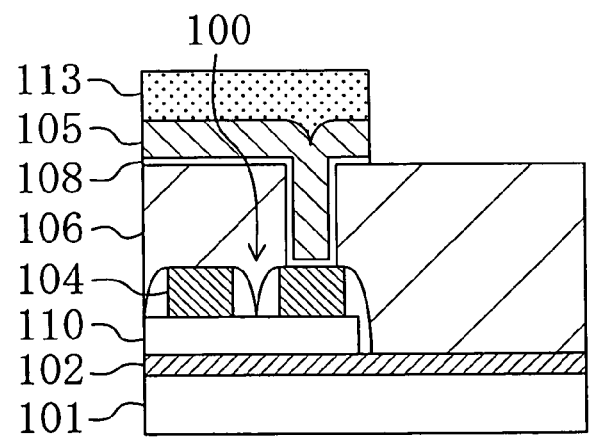
Figure 12C:
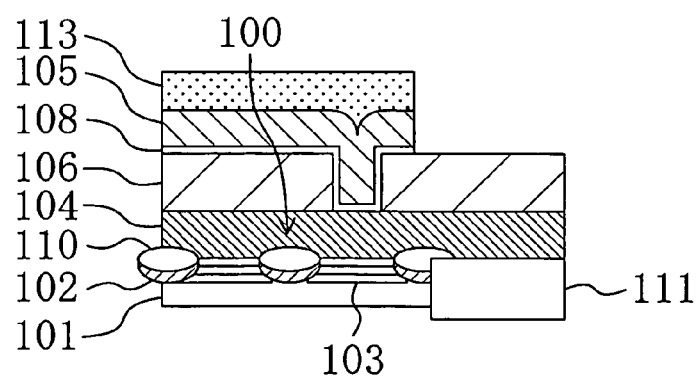

Then, as shown in FIGS. 11C and 12C, a stack of an insulating light blocking film 108 and a conductive light blocking film 105 is provided on at least part of the interlayer insulating film 106 covering the memory cells 100. In this step, part of the film stack extends in the openings 115 formed in the interlayer insulating film 106 near the region for forming the bit line contact plugs and the region for the word line contact plugs. Then, the film stack is partially etched away using a photomask 113 to leave part of the film stack covering the memory cells 100.

Figure 11D:
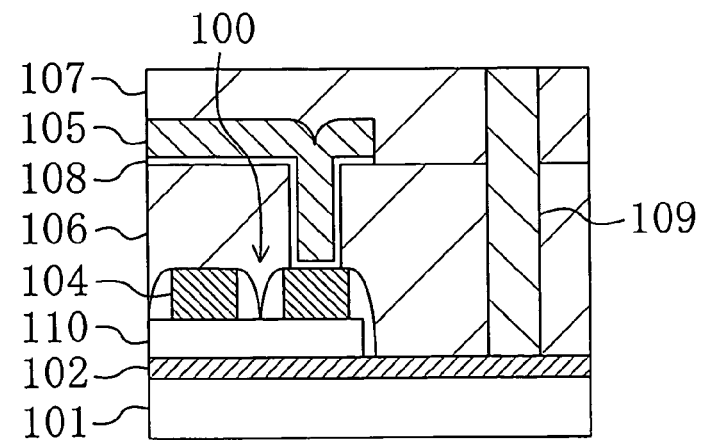
Figure 12D:
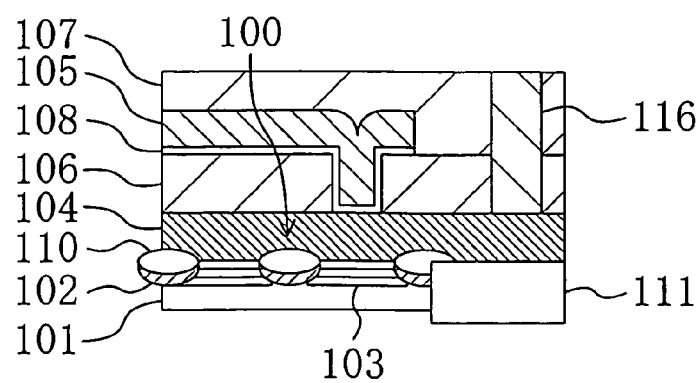

Then, as shown in FIGS. 11D and 12D, an insulating film 107 is deposited over the stack of the light blocking films 108 and 105. Then, bit line contact plugs 109 and word line contact plugs 116 are formed in the insulating film 107 and the interlayer insulating film 106 to be connected to the bit lines 102 and the word lines 104, respectively. Thus, the semiconductor memory as shown in FIGS. 10A and 10B is obtained.

The openings 115 formed in the interlayer insulating film 106 are provided by etching the interlayer insulating film 106 until the word lines 104 are exposed. Therefore, the depth of the openings 115 is easily controlled. Further, since the insulating light blocking film 108 is deposited by CVD, the insulating light blocking film 108 is deposited on the side surfaces and the bottom surface of the openings 115 with a relatively small thickness. As a result, the conductive light film 105 extending in the interlayer insulating film 106 is brought closer to the word lines 104.

In the third embodiment, the stack of the insulating light blocking film 108 and the conductive light blocking film 105 is used as the light blocking film. The light blocking films 108 and 105 may have a rough interface therebetween. In terms of its property, it is impossible for the light blocking film to completely block the entry of the UV light. However, even if part of the UV light passes through the conductive light blocking film 105, the rough interface scatters the UV light to improve the light blocking property of the light blocking film stack with efficiency.

The rough interface in the film stack may be provided by depositing the insulating light blocking film 108 by inverse sputtering such as argon sputtering to make the surface of the insulating light blocking film 108 rough.

In the third embodiment, the stack of the insulating light blocking film 108 and the conductive light blocking film 105 is used as the light blocking film. However, the purpose of providing the conductive light blocking film 105 closer to the word lines 104 may be achieved by replacing the insulating light blocking film 108 with an insulating film without the light blocking property.

Fourth Embodiment

In the semiconductor memory of the third embodiment shown in FIGS. 10A and 10B, the light blocking film is made of the stack of the insulating light blocking film 108 and the conductive light blocking film 105 for the purpose of bringing the conductive light blocking film 105 closer to the word lines 104.

In contrast, a semiconductor memory of the fourth embodiment of the present invention makes full use of the light blocking property of the insulating light blocking film. Hereinafter, specific explanation will be provided with reference to FIGS. 13A and 13B, while detailed explanation of the same components as those described in the first to third embodiments is omitted.

Figure 13A:
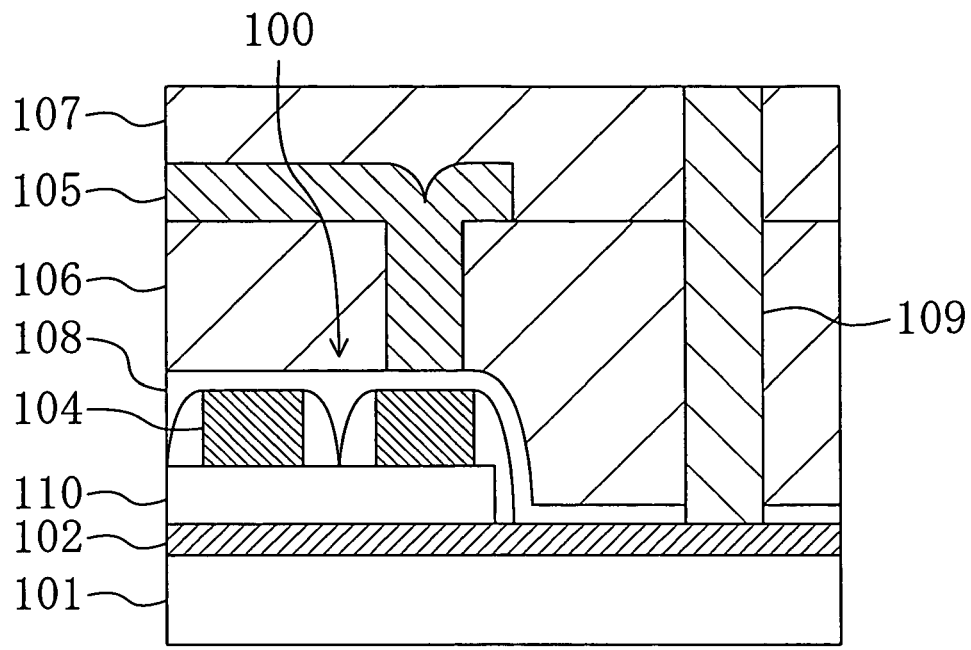
FIG. 13A is a sectional view illustrating the neighborhood of bit line contact plugs of a semiconductor memory according to a fourth embodiment of the present invention and FIG. 13B is a sectional view illustrating the neighborhood of word line contact plugs of the same.
Figure 13B:
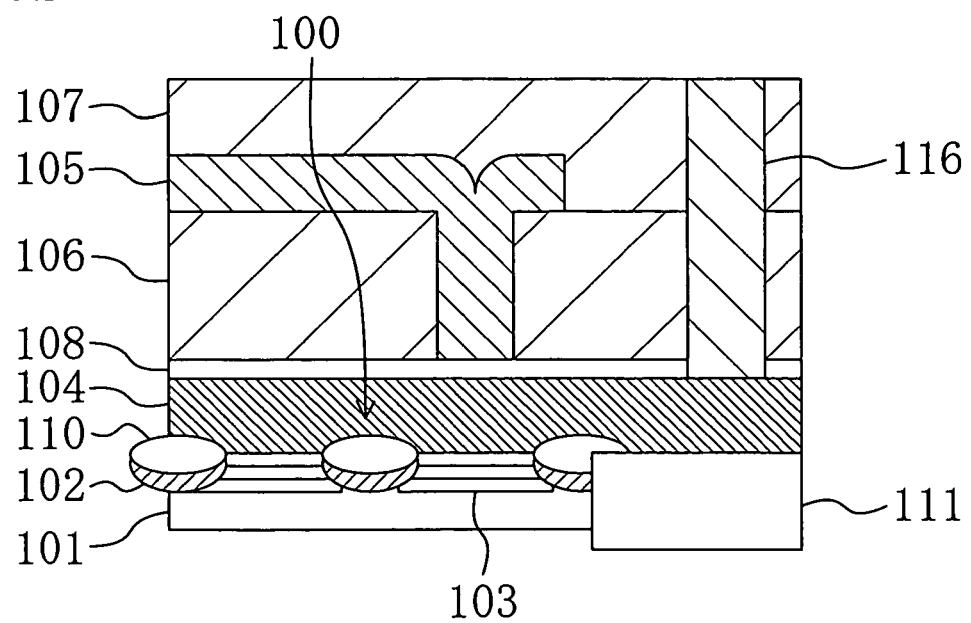

FIGS. 13A and 13B are sectional views illustrating the structure of a semiconductor memory of the fourth embodiment of the present invention. FIG. 13A shows the neighborhood of the bit line contact plugs 109 and FIG. 13B shows the neighborhood of the word line contact plugs 116.

As shown in FIGS. 13A and 13B, bit lines 102 made of a diffusion layer are formed on a semiconductor substrate 101, charge-trapping gate insulating films 103 are formed between the bit lines 102 and word lines 104 are formed on the gate insulating films 103 to provide memory cells 100. An insulating light blocking film 108 is formed to cover the top and side surfaces of the memory cells 100 and an interlayer insulating film 106 is deposited thereon. Further, bit line contact plugs 109 and word line contact plugs 116 are formed in the interlayer insulating film 106 to be connected to the bit lines 102 and the word lines 104, respectively.

A light blocking film 105 is provided on at least part of the interlayer insulating film 106 covering the memory cells 100. Parts of the light blocking film 105 near the bit line contact plugs 109 and the word line contact plugs 116 are configured to extend from the surface to the inside of the interlayer insulating film 106. The extending parts of the light blocking film 105 are in contact with the insulating light blocking film 108 formed on the word lines 104.

Specifically, the semiconductor memory of the fourth embodiment is achieved by inserting the insulating light blocking film 108 between the memory cells 100 and the interlayer insulating film 106 of the semiconductor memory of the first embodiment such that the top and side surfaces of the memory cells 100 are covered with the light blocking film 108.

In addition to the effect of blocking the UV light achieved by the semiconductor memory of the first embodiment, the structure shown in FIGS. 13A and 13B additionally exhibits the light blocking effect by the insulating light blocking film 108 covering the memory cells 100. Therefore, the UV light generated during the formation of the contact plugs and wires is prevented from entering the memory cells 100 with high efficiency.

Next, explanation of a method for manufacturing the semiconductor memory of the fourth embodiment will be provided with reference to FIGS. 14A to 14D and FIGS. 15A to 15D, while detailed explanation of the same steps as those described in the first to third embodiment is omitted.

FIGS. 14A to 14D and FIGS. 15A to 15D are sectional views illustrating the steps of the method for manufacturing the semiconductor memory of the present embodiment. FIGS. 14A to 14D show the neighborhood of the bit line contact plugs 109 and FIGS. 15A to 15D show the neighborhood of the word line contact plugs 116.

Figure 14A:
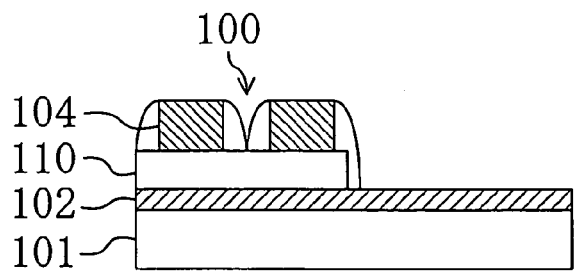
FIGS. 14A to 14D are sectional views illustrating the steps of a method for manufacturing the semiconductor memory according to the fourth embodiment of the present invention.
Figure 15A:
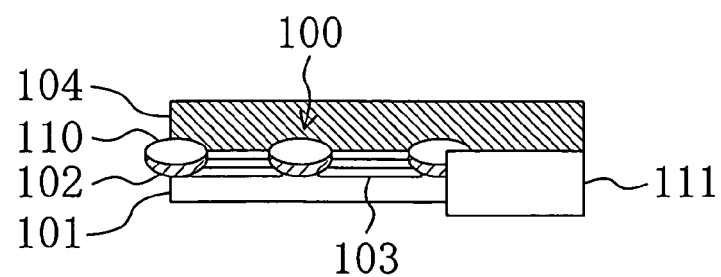
FIGS. 15A to 15D are sectional views illustrating the steps of the method for manufacturing the semiconductor memory according to the fourth embodiment of the present invention.

First, as shown in FIGS. 14A and 15A, bit lines 102, bit line oxide films 110, charge-trapping gate insulating films 103 and word lines 104 are formed on a semiconductor substrate 101 to provide memory cells 100.

Figure 14B:
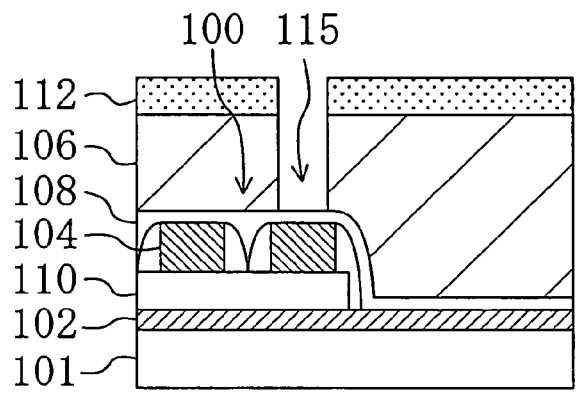
Figure 15B:
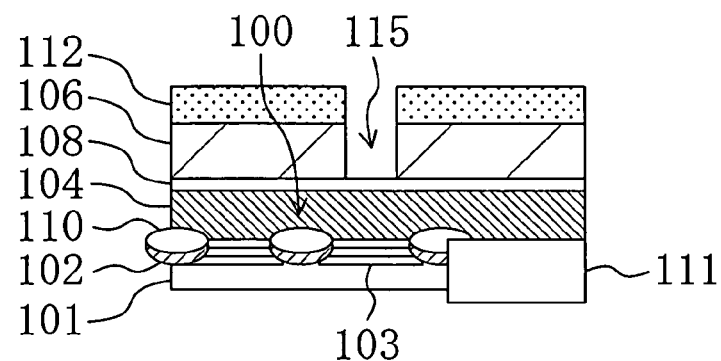

Then, as shown in FIGS. 14B and 15B, an insulating light blocking film 108 of about 20 to 50 nm thick is formed to cover the top and side surfaces of the memory cells 100 and an interlayer insulating film 106 is deposited thereon. Then, parts of the interlayer insulating film 106 near the region for forming the bit line contact plugs and the region for forming the word line contact plugs are etched away using a photomask 112 until the surface of the insulating light blocking film 108 is exposed, thereby forming openings 115.

Figure 14C:
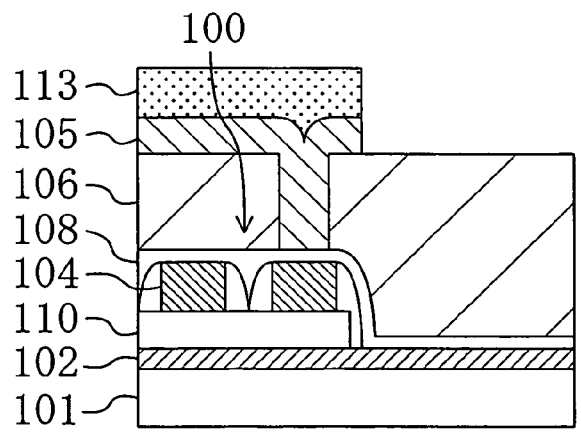
Figure 15C:
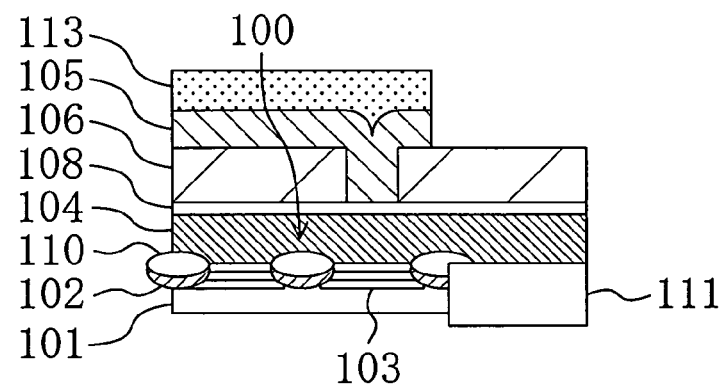

Then, as shown in FIGS. 14C and 15C, a light blocking film 105 is formed on at least part of the interlayer insulating film 106 covering the memory cells 100. At this time, parts of the light blocking film 105 extend in the openings 115 formed in the interlayer insulating film 106 near the region for forming the bit line contact plugs and the region for forming the word line contact plugs. Then, the light blocking film 105 is partially etched away using a photomask 113 to leave part of the light blocking film 105 covering the memory cells 100.

Figure 14D:
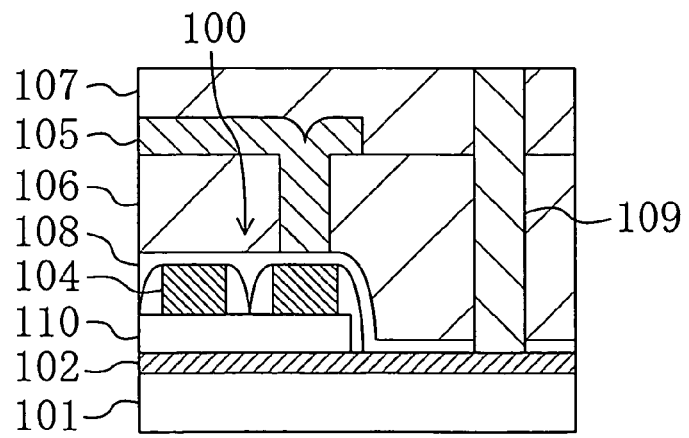
Figure 15D:
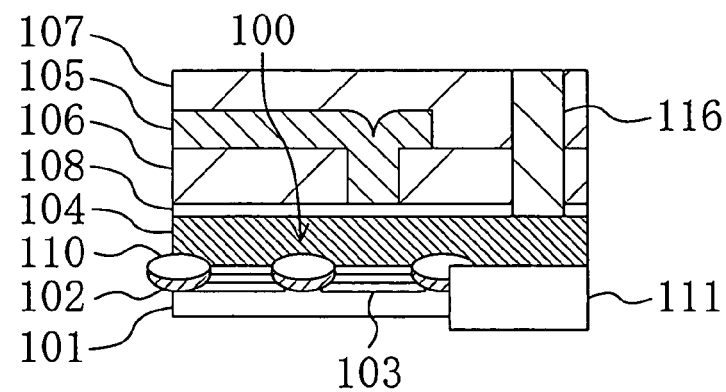

Then, as shown in FIGS. 14D and 15D, an insulating film 107 is deposited over the light blocking film 105 and bit line contact plugs 109 and word line contact plugs 116 are formed in the insulating film 107 and the interlayer insulating film 106 to be connected to the bit lines 102 and the word lines 104, respectively. Thus, the semiconductor memory shown in FIGS. 13A and 13B is obtained.

The openings 115 are formed in the interlayer insulating film 106 by etching until the surface of the insulating light blocking film 108 is exposed. At this time, the insulating light blocking film 108 functions as an etch stopper. Further, since the insulating light blocking film 108 formed on the word lines 104 is relatively thin, the conductive light blocking film 105 extending in the interlayer insulating film 106 is brought closer to the word lines 104.

Also in the fourth embodiment, the insulating light blocking film 108 may have a rough surface to improve the light blocking property of the semiconductor memory to a further extent.

Fifth Embodiment

In the semiconductor memories of the first to fourth embodiments, the light blocking film 105 is formed on the memory cells 100 with the interlayer insulating film 106 interposed therebetween. The thickness of the interlayer insulating film 106 is set to a certain value in consideration of parasitic capacitance and insulation between the word lines 104 and the light blocking film 105. Therefore, the interlayer insulating film 106 is required to be thick to some extent.

However, from the viewpoint of improvement in light blocking property, it is preferable to bring the light blocking film 105 as close as possible to the memory cells 100, i.e., the interlayer insulating film 106 is required to be thin.

According to recent status of development of the semiconductor memory, the design rules of the semiconductor memory become significantly finer, involving reduction in Vt. Under these circumstances, the fifth embodiment of the present invention proposes a semiconductor memory adaptable to future reduction in Vt. Hereinafter, specific explanation is provided with reference to FIGS. 16A and 16B, while detailed explanation of the same structure as that described in the first to fourth embodiments is omitted.

Figure 16A:
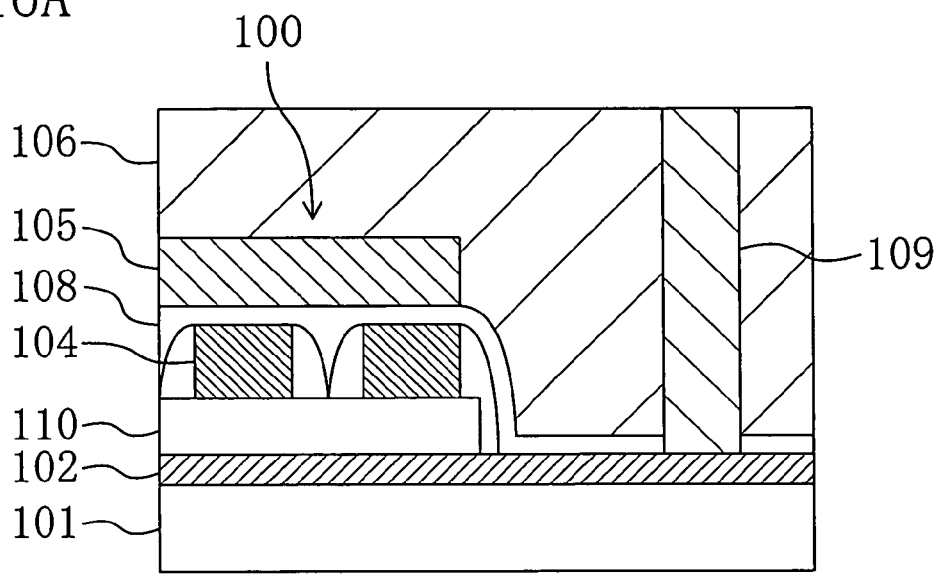
FIG. 16A is a sectional view illustrating the neighborhood of bit line contact plugs of a semiconductor memory according to a fifth embodiment of the present invention and FIG. 16B is a sectional view illustrating the neighborhood of word line contact plugs of the same.
Figure 16B:
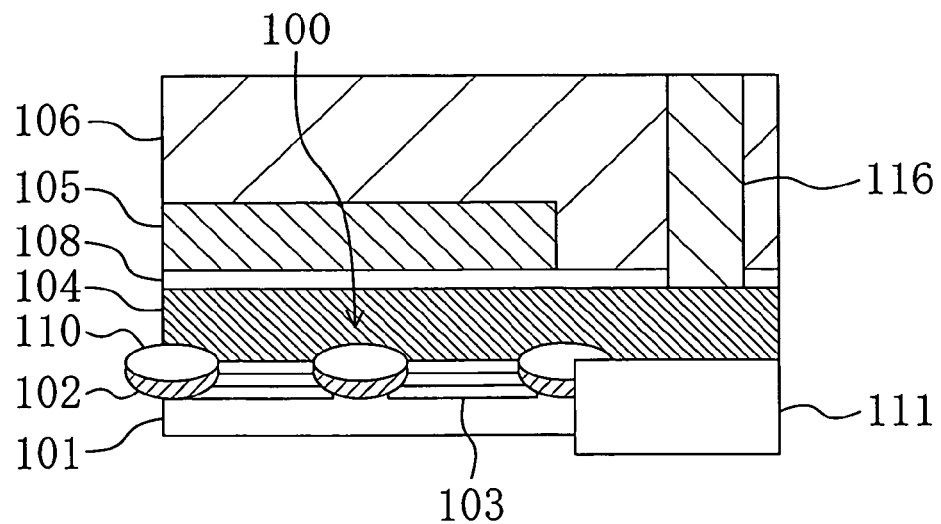
Figure 17A:
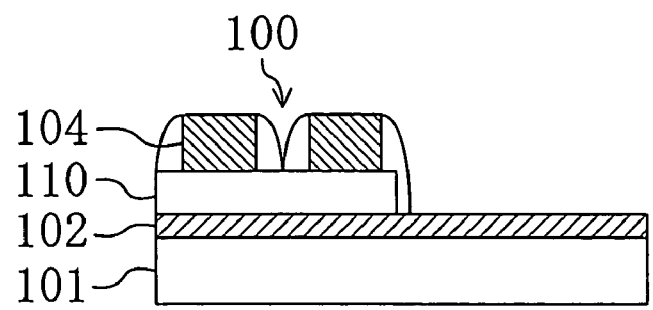
FIGS. 17A to 17C are sectional views illustrating the steps of a method for manufacturing the semiconductor memory according to the fifth embodiment of the present invention.
Figure 17B:
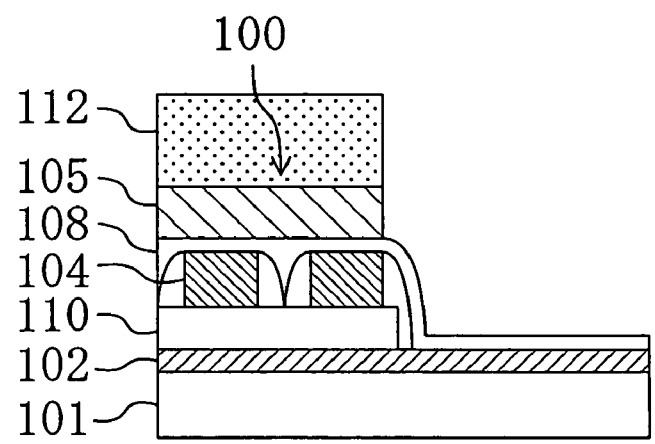
Figure 17C:
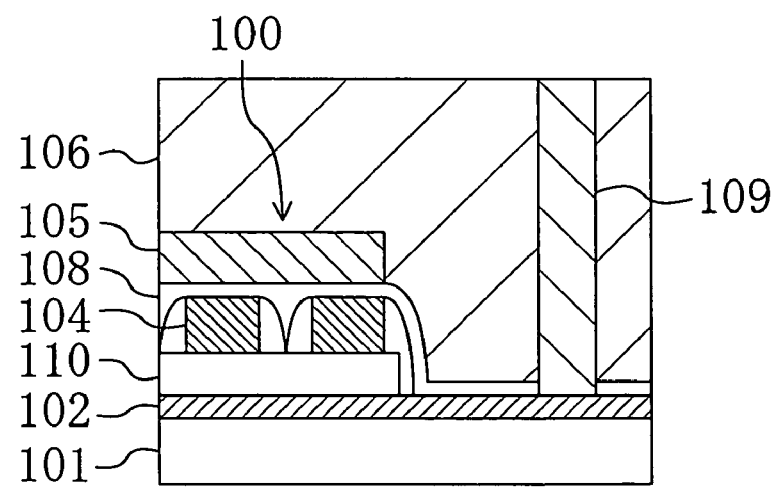
Figure 18A:
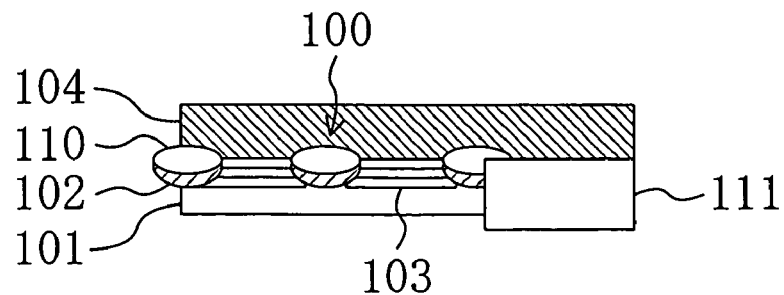
FIGS. 18A to 18C are sectional views illustrating the steps of the method for manufacturing the semiconductor memory according to the fifth embodiment of the present invention.
Figure 18B:
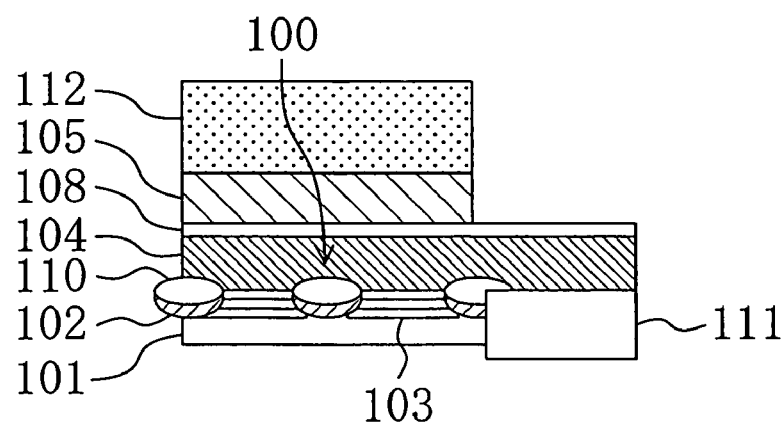
Figure 18C:
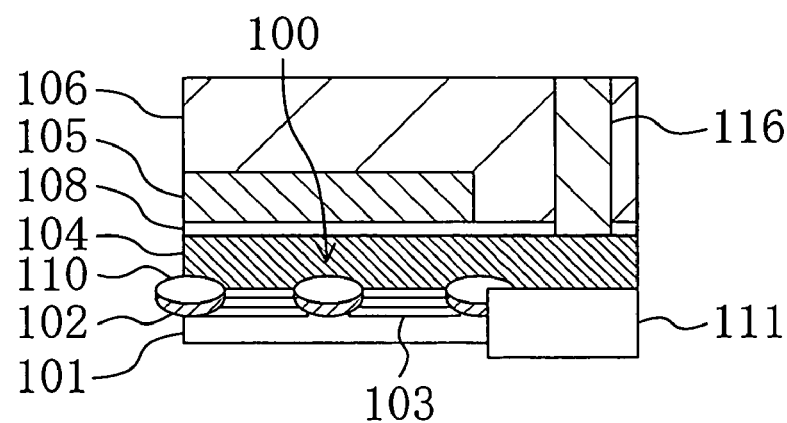

FIGS. 16A and 16B are sectional views schematically illustrating the structure of the semiconductor memory of the fifth embodiment of the present invention. FIG. 16A shows the neighborhood of the bit line contact plugs 109 and FIG. 16B shows the neighborhood of the word line contact plugs 116.

As shown in FIGS. 16A and 16B, bit lines 102 made of a diffusion layer are formed on a semiconductor substrate 101, charge-trapping gate insulating films 103 are formed between the bit lines 102 and word lines 104 are formed on the gate insulating films 103 to provide memory cells 100. An insulating light blocking film 108 is formed to cover the top and side surfaces of the memory cells 100. Further, a conductive light blocking film 105 is formed on at least part of the insulating light blocking film 108 covering the memory cells 100.

An interlayer insulating film 106 is deposited over the conductive light blocking film 105 and bit line contact plugs 109 and word line contact plugs 116 are formed in the interlayer insulating film 106 to be connected to the bit lines 102 and the word lines 104, respectively.

A feature of the semiconductor memory of the fifth embodiment is that the conductive light blocking film 105 is formed on the memory cells 100 with the thin insulating light blocking film 108 interposed therebetween instead of the interlayer insulating film 106. According to the feature, the conductive light blocking film 105 comes closer to the memory cells 100. Therefore, the light blocking effect of the conductive light blocking film 105 improves to a further extent.

In the present embodiment, it is expected that the dielectric voltage between the word lines 104 and the light blocking film 105 is reduced due to the small thickness of the insulating light blocking film 108. However, if the thickness and material of the insulating light blocking film 108 are optimized, the dielectric voltage can be adjusted in response to the reduced Vt.

Also in the present embodiment, the insulating light blocking film 108 may have a rough surface to improve the light blocking property of the semiconductor memory.

Sixth Embodiment

If the semiconductor memories of the first to fourth embodiments are designed under much finer rules, it increases the ratio of the height of the memory cells 100 with respect to the width of the region for forming the bit line contact plugs (not shown), i.e., an aspect ratio. Further, immediately after the deposition, the interlayer insulating film 106 generates a stepped portion in the neighborhood of the word line 104 adjacent to the bit line contact plugs. Specifically, difference in height occurs between the surface 106a of part of the interlayer insulating film 106 formed on the memory cells 100 and the surface 106b of another part of the interlayer insulating film 106 in the region for forming the bit line contact plugs.

Figure 19A:
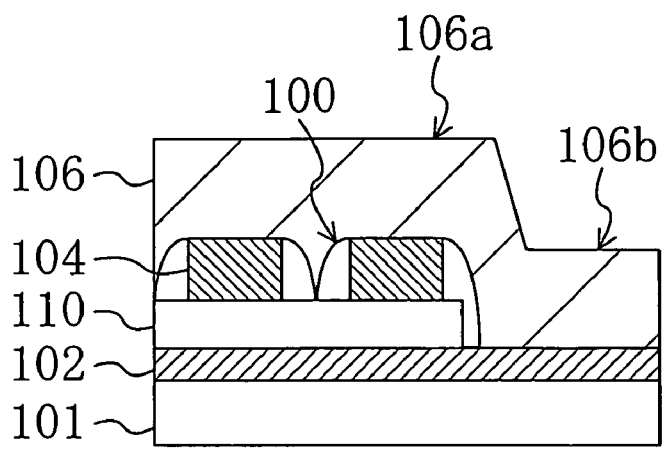
FIGS. 19A to 19C are sectional views illustrating how misalignment occurs in the step of forming an opening in an interlayer insulating film according to the present invention.
Figure 19B:
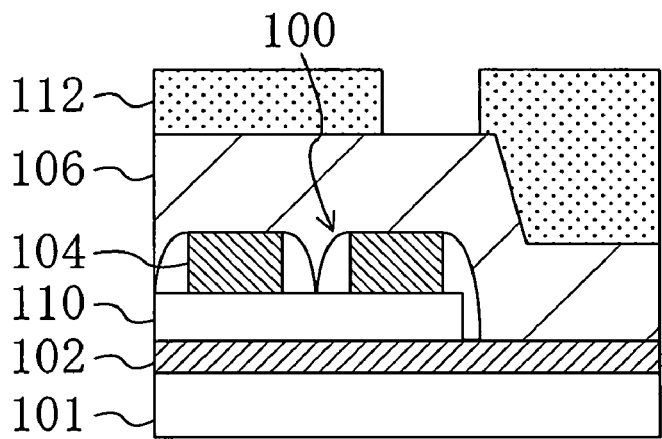
Figure 19C:
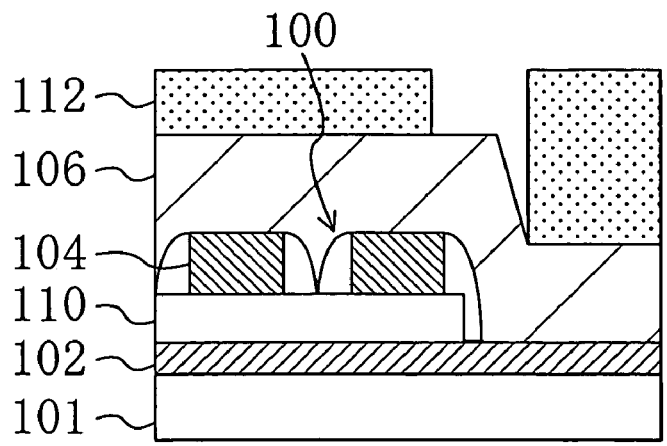

In the step of forming the opening 115 shown in FIG. 3B in the interlayer insulating film 106, an aperture in the photomask 112 for forming the opening 115 should be positioned at a flat part of the interlayer insulating film 106 as shown in FIG. 19B. However, if the interlayer insulating film 106 has a stepped portion as described above and the photomask 112 is misaligned as shown in FIG. 19C, the aperture in the photomask 112 may overlap the stepped portion. In such a case, a residue of the photoresist may remain in the stepped portion, thereby reducing the size of the resulting opening 115 smaller than the required size. As a result, the light blocking film to be deposited thereon cannot be buried in the opening 115.

In this point of view, the sixth embodiment proposes a semiconductor memory in which the opening 115 is formed with stability. Hereinafter, specific explanation is provided with reference to FIG. 20.

Figure 20:
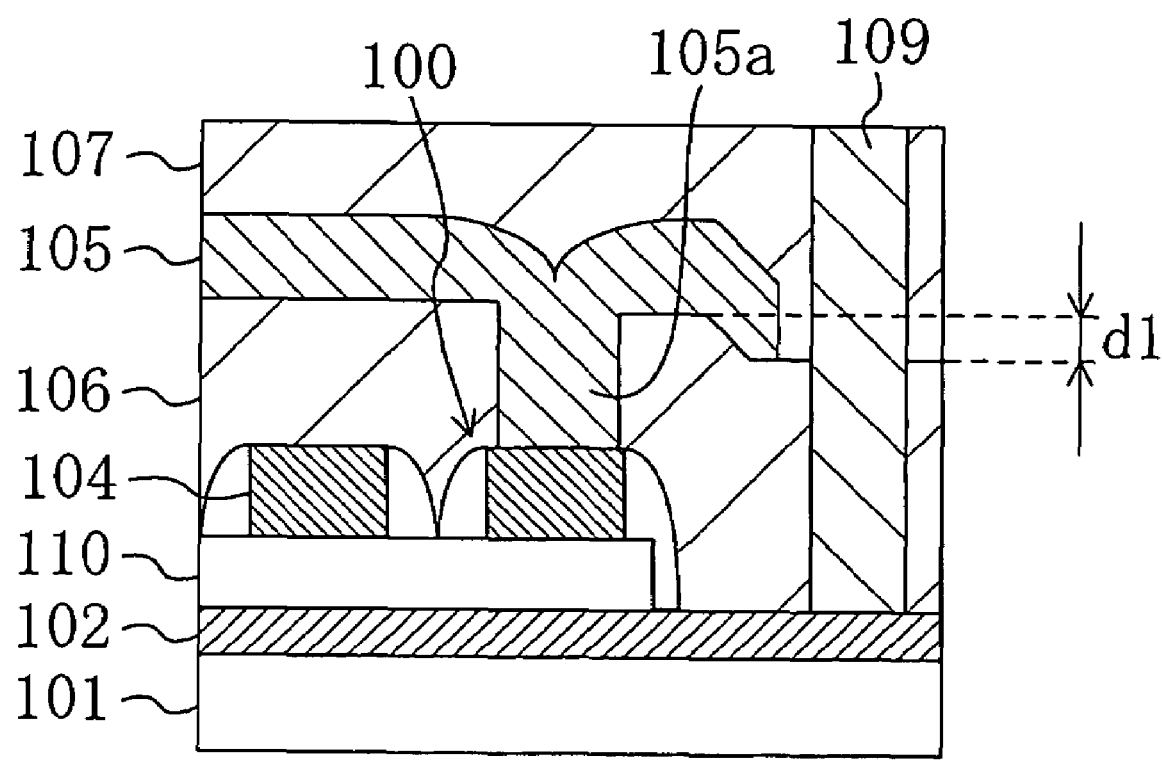
FIG. 20 is a sectional view illustrating the structure of a semiconductor memory according to a sixth embodiment of the present invention.

FIG. 20 is a sectional view of the neighborhood of the bit line contact plugs 109 for schematically illustrating the structure of the semiconductor memory of the sixth embodiment of the present invention.

As shown in FIG. 20, bit lines 102 made of a diffusion layer are formed on a semiconductor substrate 101, charge-trapping gate insulating films (not shown) are formed between the bit lines 102 and word lines 104 are formed on the gate insulating films to provide memory cells 100. An interlayer insulating film 106 is formed over the memory cells 100 and bit line contact plugs 109 are formed in the interlayer insulating film 106 to be connected to the bit lines 102.

A light blocking film 105 is formed on at least part of the interlayer insulating film 106 covering the memory cells 100. Part of the light blocking film 105 formed on the interlayer insulating film 106 (indicated by reference numeral 105a) extends from the surface to the inside of the interlayer insulating film 106 in the neighborhood of the bit line contact plugs 109.

Difference in height d1 between part of the interlayer insulating film 106 on the memory cells 100 and another part of the interlayer insulating film 106 in the region for forming the bit line contact plugs 109 is reduced by CMP (chemical mechanical polish). Therefore, the height difference d1 is smaller than the height difference generated immediately after the formation of the interlayer insulating film 106.

The stepped portion generated in part of the interlayer insulating film 106 near the word line 104 adjacent to the bit line contact plugs 109 preferably has a height of 100 nm or less.

Next, explanation of a method for manufacturing the semiconductor memory of the sixth embodiment will be provided with reference to FIGS. 21 and 22, while detailed explanation of the same steps as shown in FIGS. 3A to 3D is omitted.

FIGS. 21A to 21D and FIGS. 22A to 22C are sectional views of the neighborhood of the bit line contact plugs 109 for illustrating the steps of the method for manufacturing the semiconductor memory of the sixth embodiment.

Figure 21A:
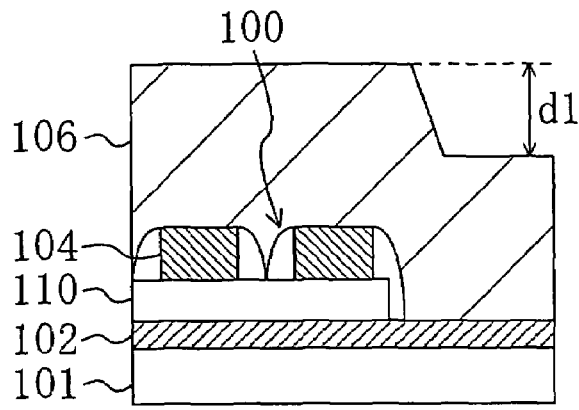
FIGS. 21A to 21D are sectional views illustrating the steps of a method for manufacturing the semiconductor memory according to the sixth embodiment of the present invention.

First, as shown in FIG. 21A, bit lines 102 made of an $n^+$ diffusion layer are formed on a semiconductor substrate 101 and bit line oxide films 110, charge-trapping gate insulating films made of an ONO film (not shown) and word lines made of polysilicon are formed thereon to provide memory cells 100. Then, an interlayer insulating film 106 made of a silicon oxide film is deposited over the memory cells 100. If the semiconductor memory has been designed under finer rules, the ratio of the height of the memory cells 100 with respect to the width of the region for forming the bit line contact plugs 109 increases. Therefore, the height difference d1 between part of the interlayer insulating film 106 on the memory cells 100 and part of the interlayer insulating film 106 in the region for forming the bit line contact plugs 109 increases up to the height of the memory cells 100. The height of the memory cells 100 from the surface of the semiconductor substrate 101 is typically about 250 nm at a maximum. Therefore, in this case, the height difference d1 of about 250 nm at a maximum occurs in the interlayer insulating film 106.

Figure 21B:
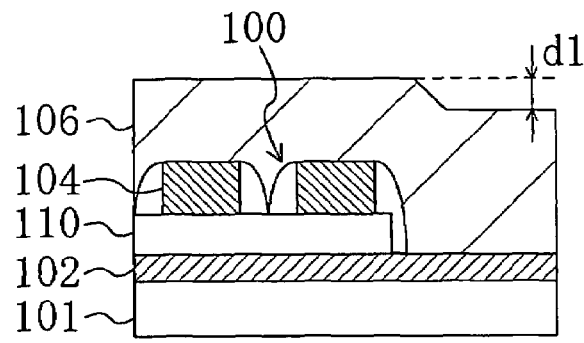

Then, as shown in FIG. 21B, the interlayer insulating film 106 is planarized by CMP to reduce the height difference d1 between the part of the interlayer insulating film 106 on the memory cells 100 and the part of the interlayer insulating film 106 in the region for forming the bit line contact plugs 109. As a result, the height difference d1 is reduced down to 100 nm or less.

Figure 21C:
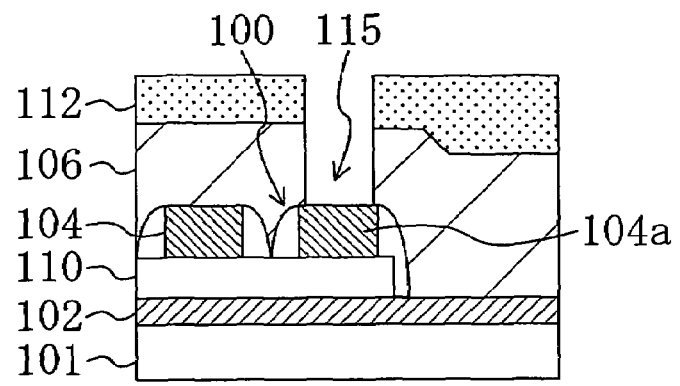

Then, as shown in FIG. 21C, an opening 115 is formed in part of the interlayer insulating film 106 near the region for forming the bit line contact plugs using a photomask 112. The opening 115 is formed to be parallel to the word lines 104.

Figure 21D:
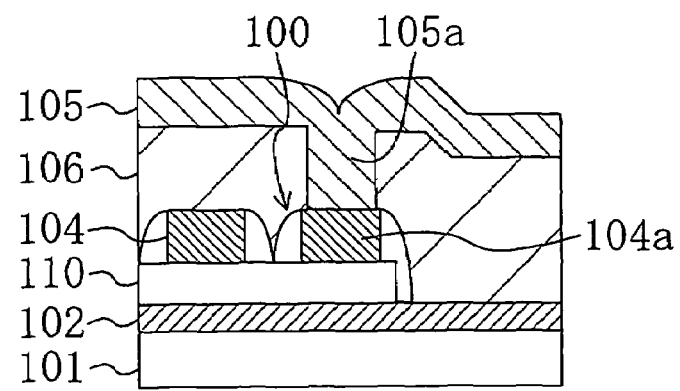

Then, as shown in FIG. 21D, a light blocking film 105 is deposited over the interlayer insulating film 106. At this time, part of the light blocking film 105 extends in the opening 115 formed in part of the interlayer insulating film 106 near the region for forming the bit line contact plugs.

Figure 22A:
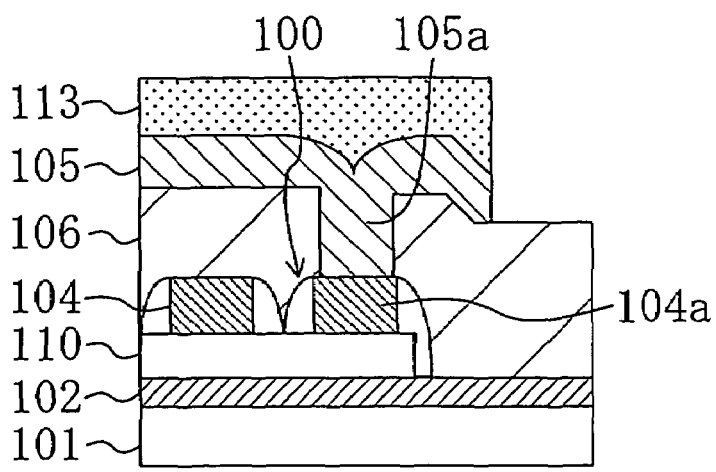
FIGS. 22A to 22C are sectional views illustrating the steps of the method for manufacturing the semiconductor memory according to the sixth embodiment of the present invention.

Then, as shown in FIG. 22A, part of the light blocking film 105 is etched away using a photomask 113 to leave part of the light blocking film 105 covering the memory cells 100.

Figure 22B:
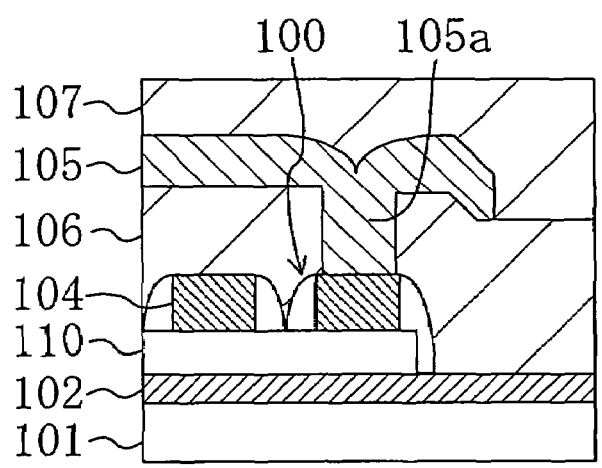

Then, as shown in FIG. 22B, an insulating film 107 made of a silicon oxide film is deposited over the entire surface. If large height difference exists between part of the insulating film 107 above the memory cells 100 and part of the insulating film 107 in the region for forming the bit line contact plugs, CMP is performed to reduce the height difference as required.

Figure 22C:
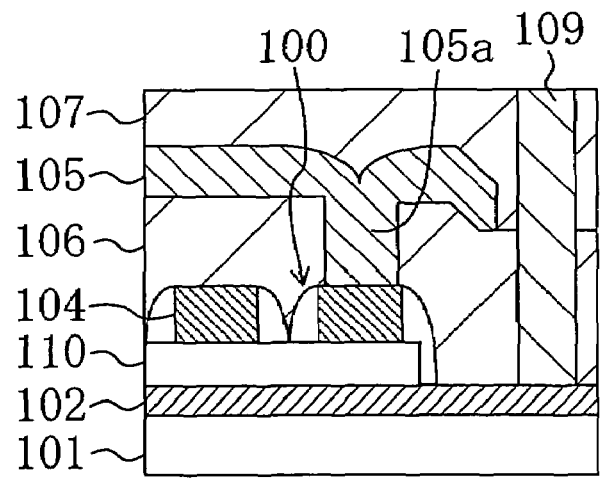

Then, as shown in FIG. 22C, bit line contact plugs 109 are formed in the insulating film 107 and the interlayer insulating film 106 to be connected to the bit lines 102, thereby obtaining the semiconductor memory shown in FIG. 20.

Since the interlayer insulating film 106 is planarized by CMP as shown in FIG. 21B, the height difference between the part of the interlayer insulating film 106 on the memory cells 100 and the part of the interlayer insulating film 106 in the region for forming the bit line contact plugs is reduced. Therefore, even if the photomask 112 shown in FIG. 21C is misaligned due to failed patterning and the aperture in the photomask 112 overlaps the stepped portion of the interlayer insulating film 106, the photoresist is less likely to remain, thereby forming the opening 115 of a desired shape.

In the sixth embodiment, part 105a of the light blocking film 105 extending in the interlayer insulating film 106 may be formed not to contact the word lines 104 as shown in FIGS. 6A and 6B.

As shown in FIG. 10A, an insulating light blocking film and a conductive light blocking film may be formed on at least part of the interlayer insulating film 106 covering the memory cells 100 and parts of the insulating and conductive light blocking films may extend from the surface to the inside of the interlayer insulating film 106 near the bit line contact plugs 109.

Further, as shown in FIG. 13, an insulating light blocking film may be formed to cover the top and side surfaces of the memory cells 100 and the interlayer insulating film 106 may be deposited thereon.

Seventh Embodiment

If the semiconductor memory of the sixth embodiment is designed under much finer rules, the height difference d1 causes notable effect even if it is reduced by planarization by CMP. In this point of view, the seventh embodiment proposes a semiconductor memory whose light blocking property is not susceptible to the height difference d1 shown in FIG. 20. Hereinafter, specific explanation is provided with reference to FIG. 23.

Figure 23:
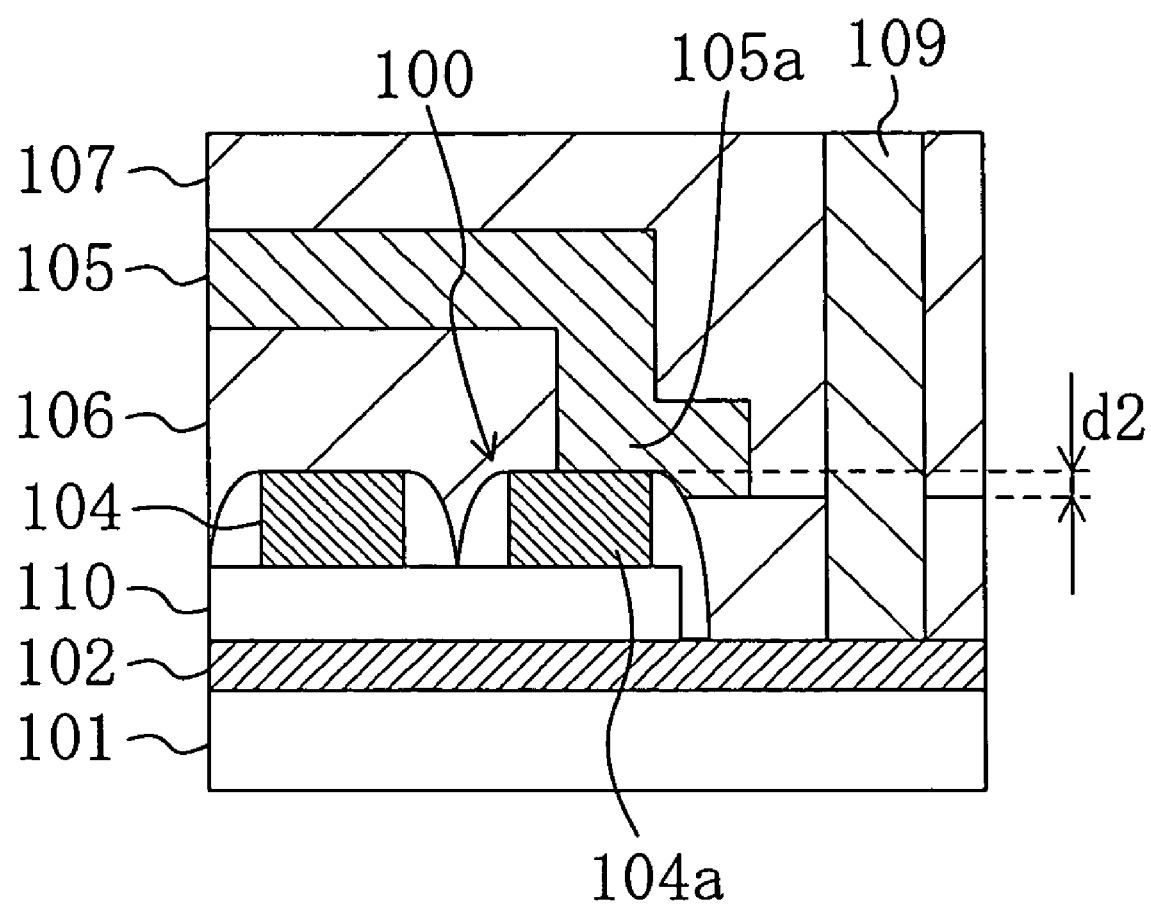
FIG. 23 is a sectional view illustrating the structure of a semiconductor memory according to a seventh embodiment of the present invention.

FIG. 23 is a sectional view of the neighborhood of the bit line contact plugs 109 for schematically illustrating the structure of a semiconductor memory of the seventh embodiment of the present invention.

As shown in FIG. 23, bit lines 102 made of a diffusion layer are formed on a semiconductor substrate 101, charge-trapping gate insulating films (not shown) are formed between the bit lines 102 and word lines 104 are formed on the gate insulating films to provide memory cells 100. An interlayer insulating film 106 is formed over the memory cells 100. A surface portion of part of the interlayer insulating film 106 overlapping with part of the word line 104a adjacent to the bit line contact plugs 109 and the region for forming the bit line contact plugs 109 is removed, thereby forming an opening in the interlayer insulating film 106 as detailed below. That is, in the opening region, the interlayer insulating film 106 does not exist above the word line 104a.

The memory cells 100 and part of the interlayer insulating film 106 at the bottom of the opening in the region for forming the bit line contact plugs 109 have difference in height d2 of 60 nm or less.

The height difference d2 is preferably small for the following reasons. A light blocking film 105 is first deposited over the entire surface including the region for forming the bit line contact plugs 109. However, due to its conductivity, the light blocking film 105 should not be in contact with the bit line contact plugs 109. Therefore, it is necessary to selectively remove part of the light blocking film 105 in the neighborhood of the bit line contact plugs 109 using a photomask. In this step, in order to avoid the photoresist from remaining in the stepped portion formed by the memory cells 100 and the interlayer insulating film 106 at the bottom of the opening in the region for forming the bit line contact plugs 109, the height difference d2 is preferably as small as 60 nm or less.

The reduced height difference d2 is effective when the distance between two word lines 104a near the bit line contact plugs 109 is reduced under finer design rules. Further, it also allows misalignment of the photomask to some extent even if a less precise photomask is used for the partial removal of the light blocking film 105 for the purpose of cost reduction.

A light blocking film 105 is formed on at least part of the interlayer insulating film 106 covering the memory cells 100. Part of the light blocking film 105 (part indicated by reference numeral 105a) extends in the opening of the interlayer insulating film 106 to cover the exposed part of the word line 104a adjacent to the bit line contact plugs 109 and part of the interlayer insulating film 106 in a region for forming the bit line contact plugs 109.

Next, explanation of a method for manufacturing the semiconductor memory of the seventh embodiment will be provided with reference to FIGS. 24A to 24D and 25A to 25C, while detailed explanation of the same steps as those of the sixth embodiment shown in FIGS. 21A to 21D and FIGS. 22A to 22C is omitted.

FIGS. 24A to 24D and FIGS. 25A to 25C are sectional views of the neighborhood of the bit line contact plugs 109 for illustrating the steps of the method for manufacturing the semiconductor memory according to the seventh embodiment.

Figure 24A:
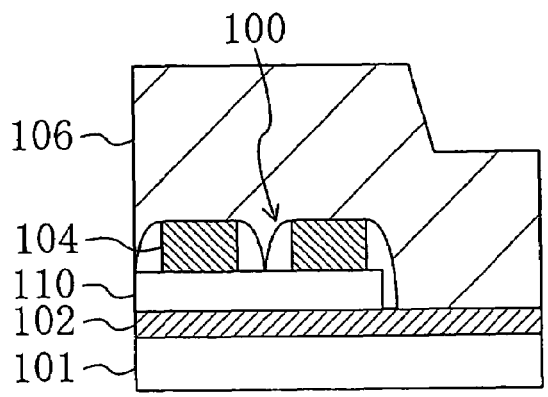
FIGS. 24A to 24D are sectional views illustrating the steps of a method for manufacturing the semiconductor memory according to the seventh embodiment of the present invention.

First, as shown in FIG. 24A, bit lines 102 made of an n$^+$ diffusion layer are formed on a semiconductor substrate 101 and bit line oxide films 110, charge-trapping gate insulating films made of an ONO film (not shown) and word lines 104 made of polysilicon are formed thereon to provide memory cells 100. An interlayer insulating film 106 is formed over the memory cells 100. If the semiconductor memory is designed under finer rules, part of the interlayer insulating film 106 formed on the memory cells 100 and part of the interlayer insulating film 106 in the region for forming the bit line contact plugs 109 generate difference in height up to the height of the memory cells 100.

Figure 24B:
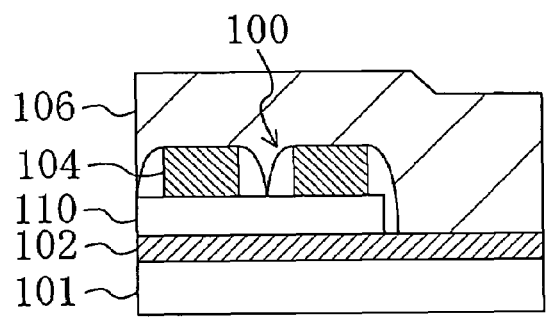

Then, as shown in FIG. 24B, the interlayer insulating film 106 is planarized by CMP to reduce the height difference between part of the interlayer insulating film 106 on the memory cells 100 and part of the interlayer insulating film 106 in the region for forming the bit line contact plugs.

Figure 24C:
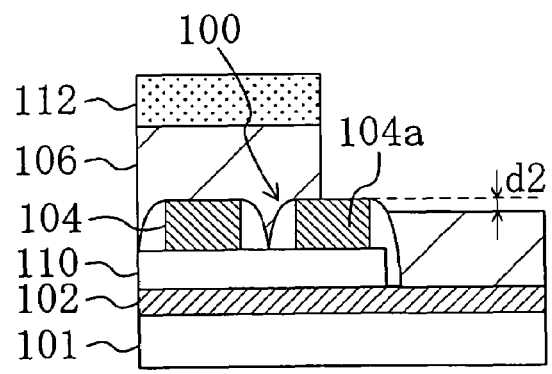

Then, as shown in FIG. 24C, part of the interlayer insulating film 106 is removed using a photomask 112 until part of the word line 104a adjacent to the region for forming the bit line contact plugs is exposed. At this time, the interlayer insulating film 106 still remains in the region for forming the bit line contact plugs below the word lines 104. The height difference d2 from the surface of the memory cells 100 (word lines 104) to the surface of the interlayer insulating film 106 remaining in the region for forming the bit line contact plugs is 60 nm or less.

Figure 24D:
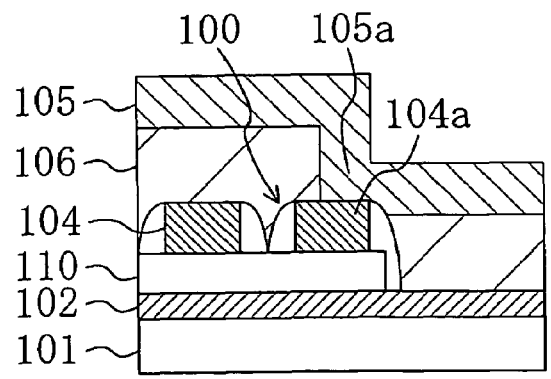

Then, as shown in FIG. 24D, a light blocking film 105 is deposited over the interlayer insulating film 106 and the word line 104a. In this step, the light blocking film 105 extends in the opening formed in the insulating film 106 to cover part of the word line 104a and the region for forming the bit line contact plugs (part indicated by reference numeral 105a).

Figure 25A:
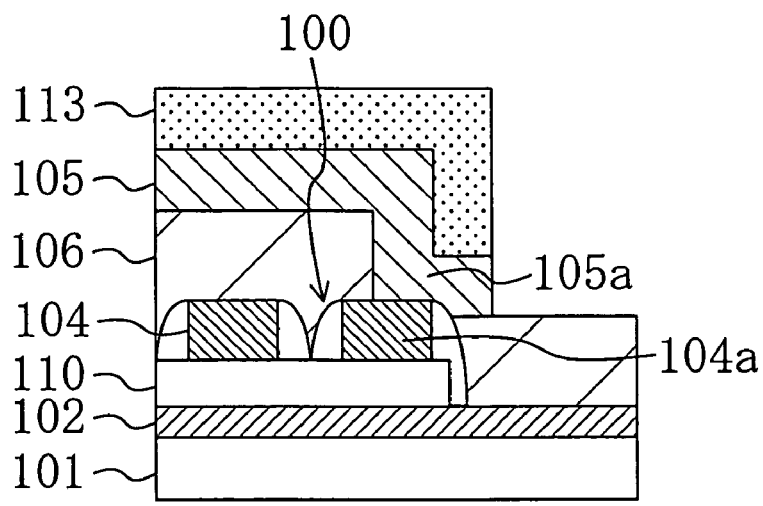
FIGS. 25A to 25C are sectional views illustrating the steps of the method for manufacturing the semiconductor memory according to the seventh embodiment of the present invention.

Then, as shown in FIG. 25A, the light blocking film 105 is removed from the region for forming the bit line contact plugs using a photomask 113. As a result, the light blocking film 105 remains above the memory cells 100, part of the word line 104a and the neighborhood of the region for forming the bit line contact plugs.

Figure 25B:
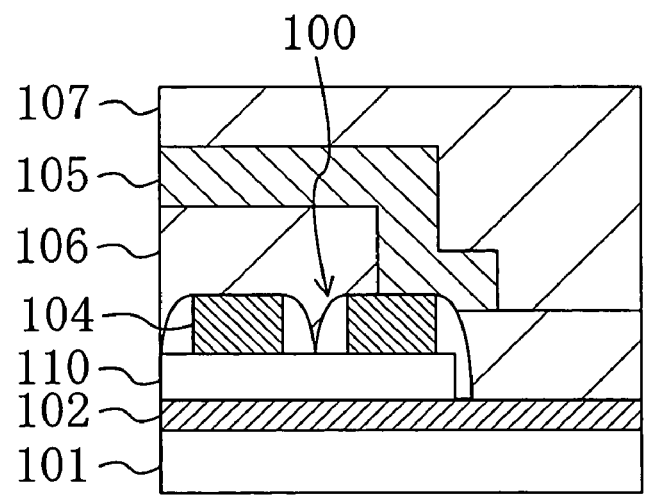

Then, as shown in FIG. 25B, an insulating film 107 made of a silicon oxide film is deposited over the entire surface. If a difference in height between part of the insulating film 107 located above the memory cells 100 and part of the insulating film 107 in the region for forming the bit line contact plugs is large, the height difference is reduced by CMP as required.

Figure 25C:
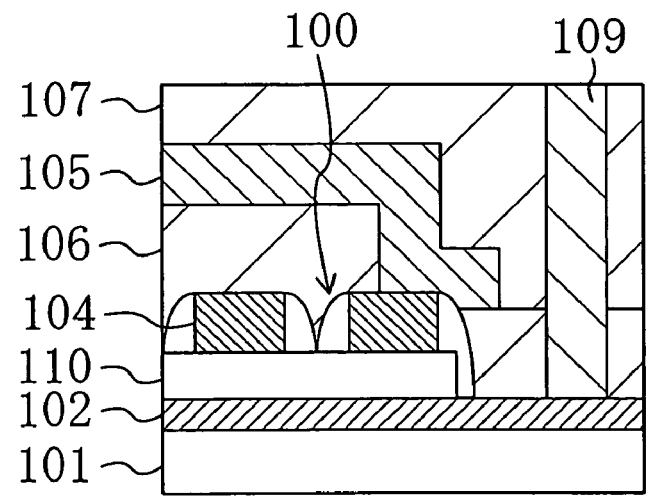
Figure 26:
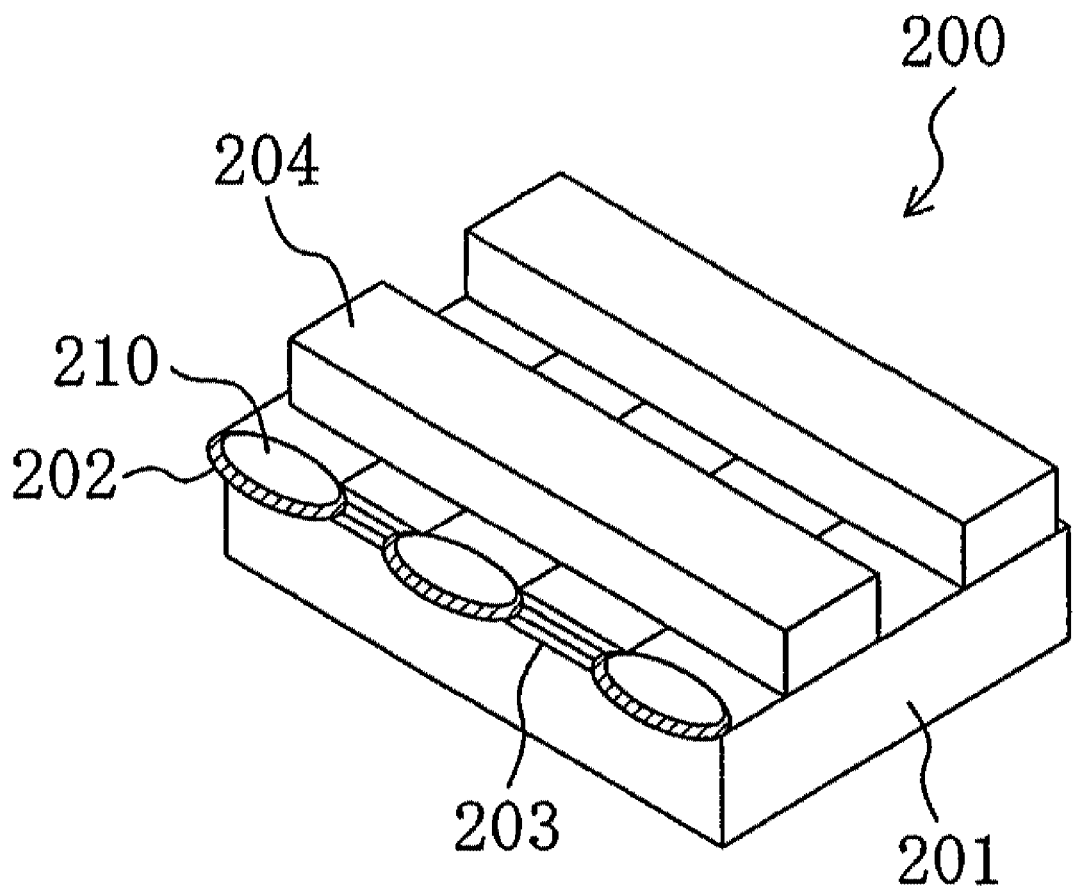
FIG. 26 is a view illustrating a typical structure of a conventional memory cell including a charge-trapping gate insulating film.
Figure 27A:
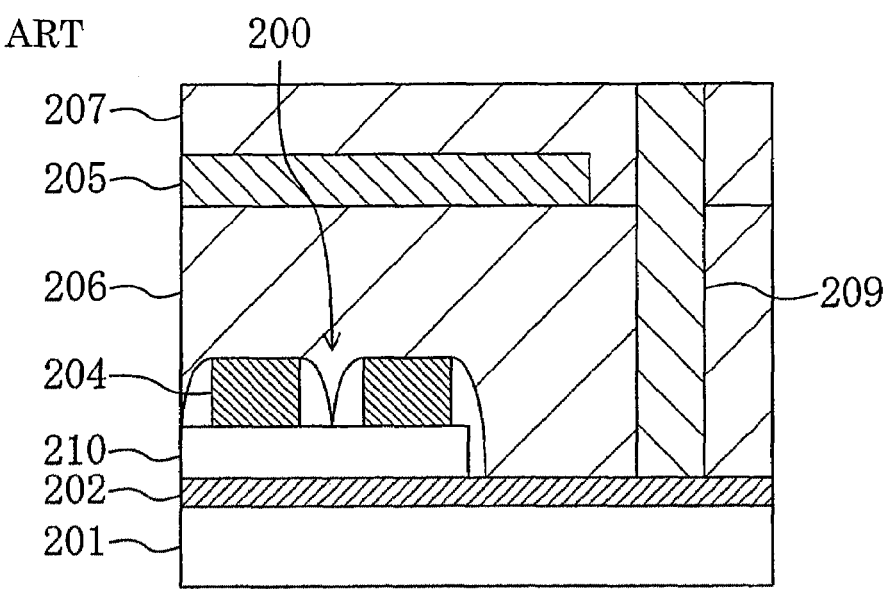
FIG. 27A is a sectional view illustrating the neighborhood of bit line contact plugs of a conventional semiconductor memory and FIG. 27B is a sectional view illustrating the neighborhood of word line contact plugs of the same.
Figure 27B:
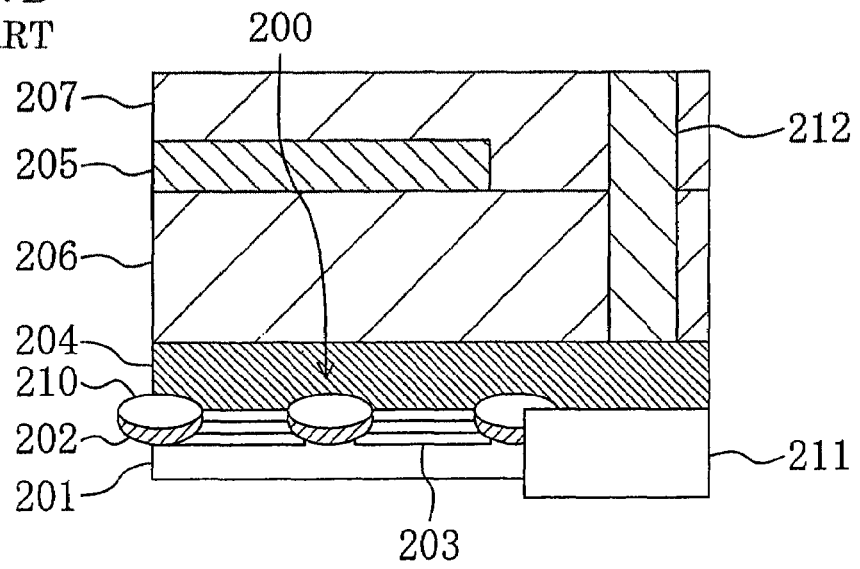
Figure 28A:
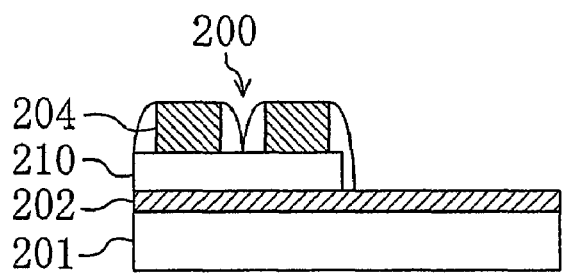
FIGS. 28A to 28D are sectional views illustrating a method for manufacturing the conventional semiconductor memory.
Figure 28B:
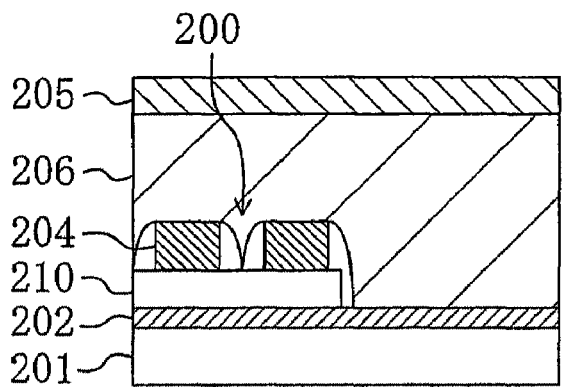
Figure 28C:
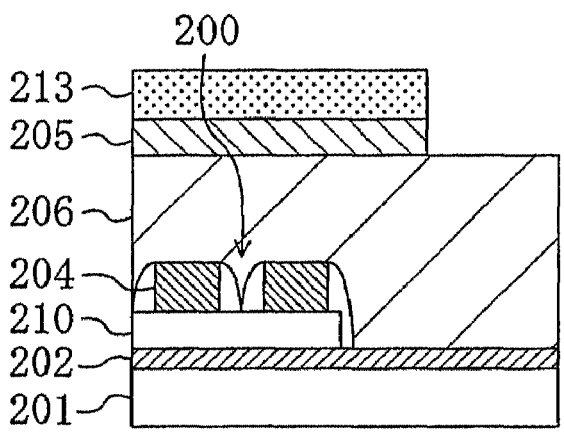
Figure 28D:
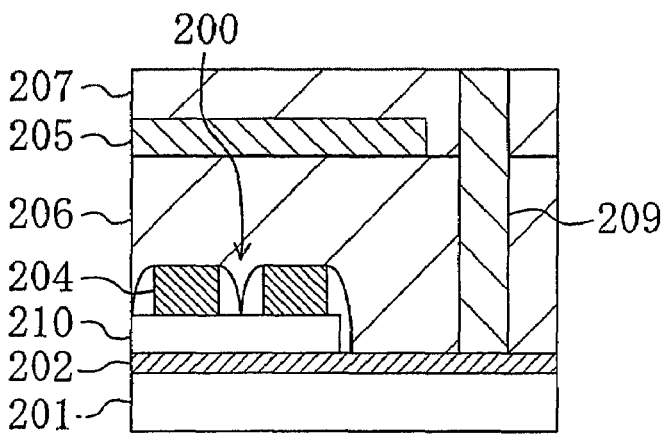
Figure 29:
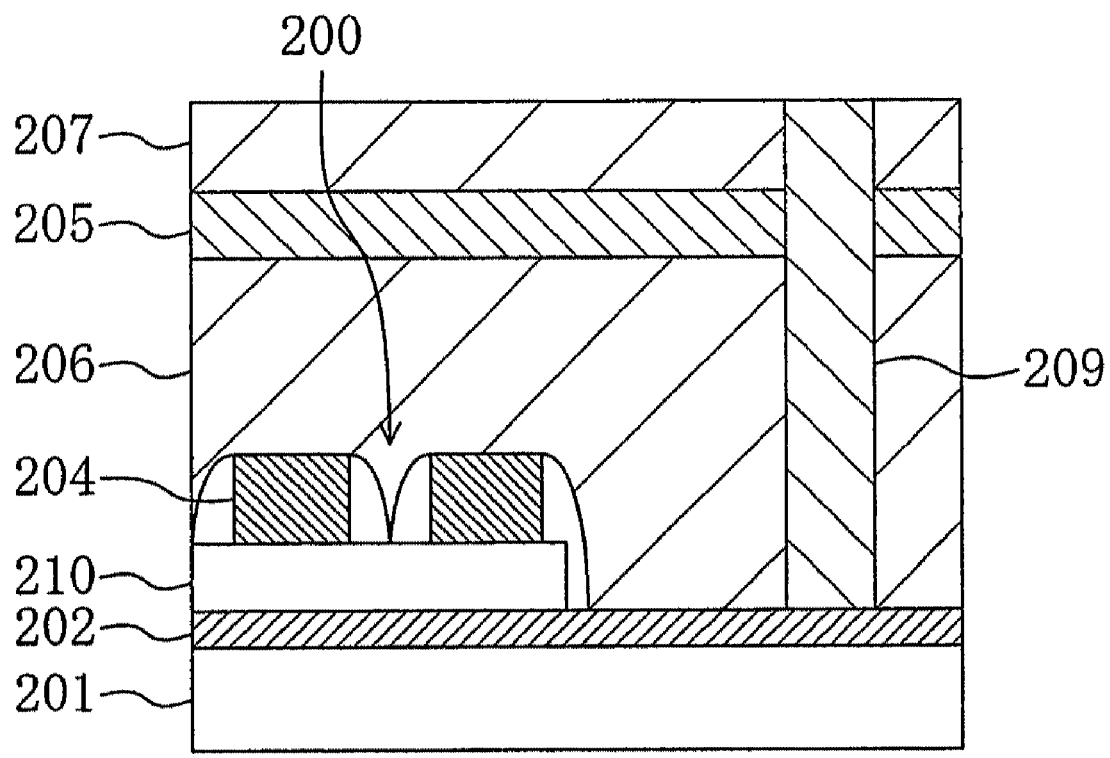
FIG. 29 is a sectional view illustrating the structure of a second conventional semiconductor memory.
Figure 30A:
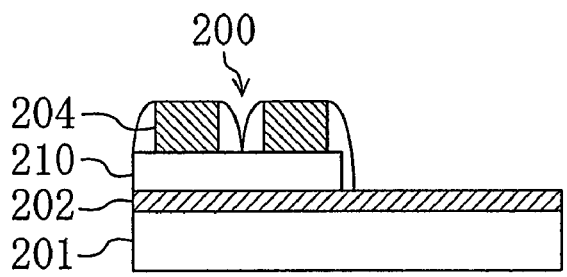
FIGS. 30A to 30D are sectional views illustrating the steps of a method for manufacturing the second conventional semiconductor memory.
Figure 30B:
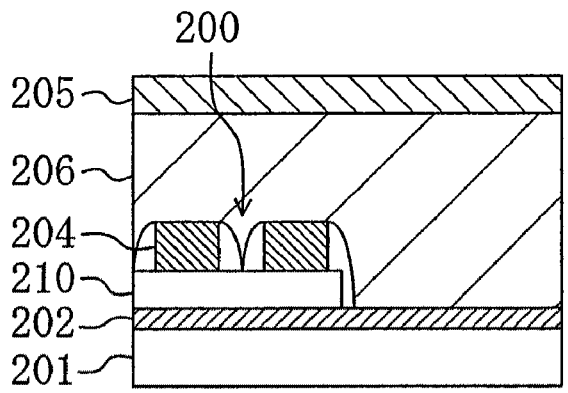
Figure 30C:
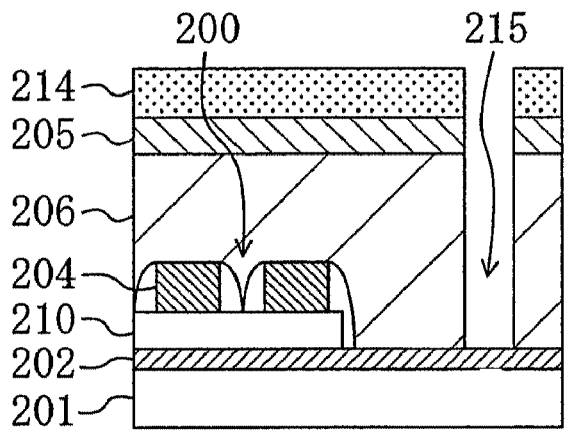
Figure 30D:
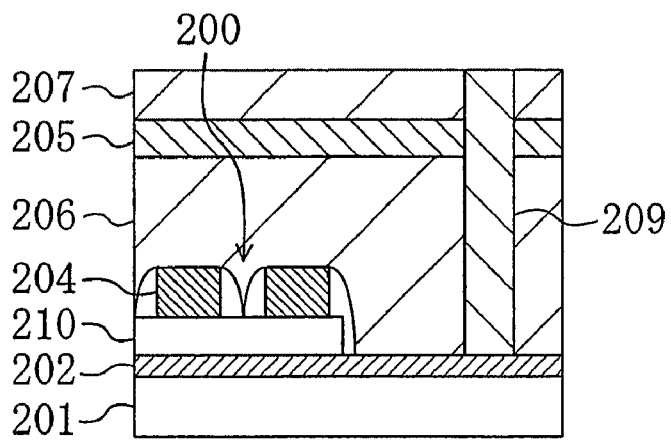

Then, as shown in FIG. 25C, bit line contact plugs 109 are formed in the insulating film 107 and the interlayer insulating film 106 to be connected to the bit lines 102. Thus, the semiconductor memory shown in FIG. 23 is obtained.

The present embodiment is different from the sixth embodiment in that the photomask 112 shown in FIG. 24C is patterned such that it has an aperture which exposes the part of the word line 104a and the region for forming the bit line contact plugs. Therefore, even if the photomask 112 is misaligned, the aperture of the photomask 112 does not overlap the stepped portion of the interlayer insulating film 106 generated by the word line 104a and the region for forming the bit line contact plugs.

In the step shown in FIG. 25A, if the two word lines 104a near the bit line contact plugs are arranged at a small pitch under the finer design rules, or if the photomask 113 used is not a precise one for reduction in production cost and therefore misaligned, an aperture of the photomask 113 may possibly overlap the stepped portion formed by the memory cells 100 (word lines 104) and the part of the interlayer insulating film 106 in the region for forming the bit line contact plugs 109. If the aperture of the photomask 113 overlaps the stepped portion and the height of the stepped portion is large, a residue of a photoresist remains and the light blocking film 105 of a required shape cannot be obtained. For this reason, the height difference d2 needs to be reduced in advance in the step shown in FIG. 24C.

In the seventh embodiment, the part 105a of the light blocking film 105 extending in the interlayer insulating film 106 may not contact the word lines 104 as shown in FIGS. 6A and 6B.

As shown in FIG. 10A, an insulating light blocking film and a conductive light blocking film may be formed on at least part of the interlayer insulating film 106 covering the memory cells 100. Further, the insulating and conductive light blocking films may be formed to cover part of the word line 104a and part of the interlayer insulating film 106 in the region for forming the bit line contact plugs.

Still further, as shown in FIG. 13A, an insulating light blocking film may be formed to cover the top and side surfaces of the memory cells 100 and the interlayer insulating film 106 may be deposited thereon.

In the present invention, "interlayer insulating film" includes at least an electric insulator for mutual insulation between the memory cells, bit line contact plugs and word line contact plugs and an electric insulator for insulation between the memory cells and other components of the semiconductor memory (e.g., wires). Material for the interlayer insulating film and how the interlayer insulating film is formed are not particularly limited. For example, a stack of two or more layers made of different materials may also be used as the interlayer insulating film.

It should be understood that the present invention is not limited by the above-described preferred embodiments of the invention and may be modified in various ways. For example, the embodiments have focused on the memory cells including charge-trapping gate insulating films. However, the present invention can be applied to memory cells of other structures as long as data writing into the memory cells is controlled by electron injection.

Thus, according to the present invention, a highly reliable semiconductor memory and a method for manufacturing the same are provided while the variations in Vt due to the UV light generated during the manufacture of the semiconductor memory are prevented.

What is claimed is:

1. A semiconductor memory provided with memory cells including a plurality of bit lines made of a diffusion layer formed in a semiconductor substrate, charge-trapping gate insulating films formed between the bit lines and word lines formed on the gate insulating films, wherein
    an interlayer insulating film is formed over the memory cells,
    bit line contact plugs are formed in the interlayer insulating film to be connected to the bit lines,
    a light blocking film is formed on at least part of the interlayer insulating film covering the memory cells and
    part of the light blocking film formed on the interlayer insulating film extends from the surface to the inside of the interlayer insulating film toward the word lines in the neighborhood of the bit line contact plugs.

2. The semiconductor memory of claim 1, wherein
    the part of the light blocking film extending in the interlayer insulating film is parallel to the word lines.

3. The semiconductor memory of claim 1, wherein
    the part of the light blocking film extending in the interlayer insulating film is in contact with the word line adjacent to the bit line contact plugs.

4. The semiconductor memory of claim 3, wherein
    the part of the light blocking film extending in the interlayer insulating film is in contact with said word line with an insulating film interposed therebetween.

5. The semiconductor memory of claim 4, wherein
    the insulating film is an insulating light blocking film.

6. The semiconductor memory of claim 1, wherein
    word line contact plugs are formed in the interlayer insulating film to be connected to the word lines and
    another part of the light blocking film extends in the interlayer insulating film in the neighborhood of the word line contact plugs.

7. The semiconductor memory of claim 6, wherein
    said another part of the light blocking film extending in the interlayer insulating film is parallel to the bit lines.

8. The semiconductor memory of claim 1, wherein
    the part of the light blocking film extending toward the word lines in the interlayer insulating film is formed all over the inside of a groove in the interlayer insulating film.

9. The semiconductor memory of claim 1, wherein
    the light blocking film is made of a stack of a conductive light blocking film and an insulating light blocking film.

10. The semiconductor memory of claim 9, wherein
    the conductive light blocking film and the insulating light blocking film has a rough interface therebetween.

11. The semiconductor memory of claim 3, wherein
    the word line in contact with the part of the light blocking film is a dummy word line which is not used for data storage.

12. The semiconductor memory of claim 1, wherein
    the light blocking film is formed before the formation of the bit line contact plugs.

13. The semiconductor memory of claim 1, wherein
    a stepped portion is formed in part of the interlayer insulating film near the word line adjacent to the bit line contact plugs and the height of the stepped portion is reduced to 100 nm or less by planarization.

14. The semiconductor memory of claim 1, wherein
the height of the part of the interlayer insulating film in which the bit line contact plugs are formed is not larger than the height of the word line adjacent to the bit line contact plugs.

15. The semiconductor memory of claim 14, wherein
difference in height between the part of the interlayer insulating film in which the bit line contact plugs are formed and the word line adjacent to the bit line contact plugs is 60 nm or less.

16. A semiconductor memory provided with memory cells including a plurality of bit lines made of a diffusion layer formed in a semiconductor substrate, charge-trapping gate insulating films formed between the bit lines and word lines formed on the gate insulating films, wherein
   an insulating light blocking film is formed directly on the word lines to cover a top surface and side surfaces of the memory cells and
   a conductive light blocking film is formed directly on at least part of the insulating light blocking film covering the memory cells.

17. A method for manufacturing a semiconductor memory provided with memory cells including a plurality of bit lines made of a diffusion layer formed in a semiconductor substrate, charge-trapping gate insulating films formed between the bit lines and word lines formed on the gate insulating films, the method comprising the steps of:
   forming an interlayer insulating film over the memory cells;
   forming a light blocking film on at least part of the interlayer insulating film covering the memory cells; and
   forming bit line contact plugs in the interlayer insulating film to be connected to the bit lines, wherein
   in the step of forming the light blocking film, part of the light blocking film formed on the interlayer insulating film extends from the surface to the inside of the interlayer insulating film toward the word lines in the neighborhood of a region for forming the bit line contact plugs.

18. The method of claim 17, wherein
the step of forming the interlayer insulating film is followed by the step of forming an opening in part of the interlayer insulating film near the region for forming the bit line contact plugs and
in the step of forming the light blocking film, the light blocking film is formed on at least part of the interlayer insulating film covering the memory cells and in the opening formed in the interlayer insulating film.

19. The method of claim 18, wherein
the opening is formed to expose the word line adjacent to the region for forming the bit line contact plugs and
the light blocking film formed in the opening is in contact with said word line.

20. The method of claim 19, wherein
the step of forming the opening is followed by the step of forming an insulating light blocking film on at least side surfaces and a bottom surface of the opening and the light blocking film is in contact with said word line with the insulating light blocking film interposed therebetween.

21. The method of claim 18, wherein
the step of forming the interlayer insulating film over the memory cells is preceded by the step of forming an insulating light blocking film to cover a top surface and side surfaces of the memory cells,
the opening is formed to expose the insulating light blocking film and
the light blocking film formed in the opening is in contact with the insulating light blocking film.

22. The method of claim 17, wherein
the step of forming the bit line contact plugs is performed after the step of forming the light blocking film.

23. The method of claim 17, wherein
the step of forming the interlayer insulating film further includes the step of planarizing the interlayer insulating film such that a stepped portion generated in part of the interlayer insulating film near the word line adjacent to the bit line contact plugs is reduced to 100 nm or less in height.

24. The method of claim 17, wherein
the step of forming the interlayer insulating film further includes the step of removing a surface portion of part of the interlayer insulating film in the region for forming the bit line contact plugs such that the height of said part of the interlayer insulating film is reduced equal to or smaller than the height of the word line adjacent to the bit line contact plugs and
in the step of forming the light blocking film, part of the light blocking film extends on said part of the interlayer insulating film reduced in height in the neighborhood of the region for forming the bit line contact plugs.

25. The method of claim 24, wherein
difference in height between said part of the interlayer insulating film reduced in height and the word line adjacent to the bit line contact plugs is 60 nm or less.

26. A method for manufacturing a semiconductor memory provided with memory cells including a plurality of bit lines made of a diffusion layer formed in a semiconductor substrate, charge-trapping gate insulating films formed between the bit lines and word lines formed on the gate insulating films, the method comprising the steps of:
   forming an insulating light blocking film directly on the word lines to cover a top surface and side surfaces of the memory cells; and
   forming a conductive light blocking film directly on at least part of the insulating light blocking film covering the memory cells.

27. The method of any one of claims 20, 21 and 22, wherein
the step of forming the insulating light blocking film is followed by the step of making the surface of the insulating light blocking film rough.

* * * * *